United States Patent
Cho et al.

(10) Patent No.: US 9,824,734 B2
(45) Date of Patent: Nov. 21, 2017

(54) NONVOLATILE MEMORY MODULE HAVING BACKUP FUNCTION

(71) Applicants: Youngjin Cho, Seoul (KR); Younggeun Lee, Seoul (KR); Han-Ju Lee, Hwaseong-si (KR); Hyo-Deok Shin, Seoul (KR)

(72) Inventors: Youngjin Cho, Seoul (KR); Younggeun Lee, Seoul (KR); Han-Ju Lee, Hwaseong-si (KR); Hyo-Deok Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/093,769

(22) Filed: Apr. 8, 2016

(65) Prior Publication Data

US 2017/0040057 A1 Feb. 9, 2017

(30) Foreign Application Priority Data

Aug. 3, 2015 (KR) ........................ 10-2015-0109520

(51) Int. Cl.
*G11C 14/00* (2006.01)
*G11C 11/00* (2006.01)
*G06F 13/16* (2006.01)
*G11C 11/4076* (2006.01)
*G11C 16/32* (2006.01)

(52) U.S. Cl.
CPC ............ *G11C 11/005* (2013.01); *G06F 13/16* (2013.01); *G11C 11/4076* (2013.01); *G11C 14/0018* (2013.01); *G11C 16/32* (2013.01)

(58) Field of Classification Search
CPC ...... G11C 16/32; G11C 11/4076; G11C 5/141
USPC ..................................................... 365/185.08
See application file for complete search history.

(56) References Cited

U.S. PATENT DOCUMENTS

| | | | |
|---|---|---|---|
| 7,024,518 B2 | 4/2006 | Halbert et al. | |
| 7,679,133 B2 | 3/2010 | Son et al. | |
| 7,865,679 B2 | 1/2011 | Sartore | |
| 7,941,591 B2 | 5/2011 | Aviles | |
| 8,008,894 B2 | 8/2011 | Sartore | |
| 8,040,750 B2 * | 10/2011 | Cagno | G11C 5/141 365/228 |
| 8,046,546 B2 | 10/2011 | Sartore | |
| 8,074,034 B2 | 12/2011 | Sartore | |
| 8,154,259 B2 | 4/2012 | Sartore | |
| 8,169,839 B2 | 5/2012 | Moshayedi et al. | |
| 8,200,885 B2 | 6/2012 | Sartore | |

(Continued)

*Primary Examiner* — Richard Elms
*Assistant Examiner* — Xiaochun L Chen
(74) *Attorney, Agent, or Firm* — Ward and Smith, P.A.

(57) ABSTRACT

Disclosed is a memory system. The memory system includes a volatile memory device configured to exchange data with a host through a first channel, a nonvolatile memory device, and a memory controller connected with the volatile memory device through a second channel. The memory controller detects a request of the host or a power state and controls the volatile memory device and the nonvolatile memory device based on the detection result such that data stored in the volatile memory device is backed up in the nonvolatile memory device through the second channel. The volatile memory device includes a first interface for communicating with the host through the first channel and a second interface for communicating with the memory controller through the second channel.

16 Claims, 28 Drawing Sheets

(56) References Cited

U.S. PATENT DOCUMENTS

| | | |
|---|---|---|
| 8,200,929 B1 | 6/2012 | Sartore |
| 8,341,332 B2 | 12/2012 | Ma et al. |
| 8,374,049 B2 | 2/2013 | Liu et al. |
| 8,392,761 B2 | 3/2013 | Monchiero et al. |
| 8,468,317 B2 | 6/2013 | Steed |
| 8,479,061 B2 | 7/2013 | Sartore |
| 8,553,466 B2 | 10/2013 | Han et al. |
| 8,559,235 B2 | 10/2013 | Yoon et al. |
| 8,638,634 B2 | 1/2014 | Hauck |
| 8,650,363 B2 | 2/2014 | Sartore |
| 8,654,587 B2 | 2/2014 | Yoon et al. |
| 8,755,243 B2 | 6/2014 | Hauck |
| 8,812,802 B2 | 8/2014 | Sartore |
| 8,819,368 B2 | 8/2014 | Sartore |
| 8,874,831 B2 | 10/2014 | Lee et al. |
| 9,013,946 B2 | 4/2015 | Sartore |
| 2009/0323452 A1* | 12/2009 | Cagno .................... G11C 5/141 365/227 |
| 2011/0233648 A1 | 9/2011 | Seol et al. |
| 2014/0059170 A1 | 2/2014 | Gasparakis et al. |
| 2014/0095769 A1 | 4/2014 | Borkenhagen |
| 2014/0108696 A1 | 4/2014 | Zimmerman et al. |
| 2014/0181364 A1 | 6/2014 | Berke et al. |
| 2014/0237157 A1 | 8/2014 | Takefman et al. |
| 2014/0258603 A1 | 9/2014 | Karamcheti et al. |
| 2015/0135039 A1* | 5/2015 | Mekhanik ........... G06F 11/1072 714/773 |
| 2015/0248935 A1* | 9/2015 | Moshayedi .............. G11C 5/14 711/103 |
| 2016/0093372 A1* | 3/2016 | Fainzilber ........... G11C 11/5642 714/764 |

* cited by examiner

NONVOLATILE MEMORY MODULE HAVING BACKUP FUNCTION

CROSS-REFERENCE TO RELATED APPLICATION

A claim for priority under 35 U.S.C. §119 is made to Korean Patent Application No. 10-2015-0109520 filed Aug. 3, 2015, in the Korean Intellectual Property Office, the entire contents of which are hereby incorporated by reference.

BACKGROUND

Embodiments of the inventive concepts described herein relate to a semiconductor memory, and more particularly, relate to a memory module having a backup function.

A semiconductor memory refers to a memory device that is implemented using semiconductor such as silicon (Si), germanium (Ge), gallium arsenide (GaAs), indium phosphide (InP), or the like. Semiconductor memory devices are roughly divided into volatile memory devices and nonvolatile memory devices.

A volatile memory device refers to a memory device which loses data stored therein at power-off. The volatile memory device includes a static random access memory (SRAM), a dynamic ram (DRAM), a synchronous DRAM or the like. A nonvolatile memory device refers to a memory device which retains data stored therein even at power-off. The nonvolatile memory device includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), or the like.

The flash memory device is widely used as a storage device in virtue of advantages such as large capacity, low noise, low power, and the like. In particular, a solid state drive (SSD) which is based on a flash memory is used as mass storage in a personal computer, a notebook, a workstation, a server system, and the like. Typical SSD devices are connected with a computing system based on a SATA interface and/or a PCI-express interface. However, as the amount of data processed on a computing system increases, data throughput becomes greater than the data bandwidth or communication speed of an interface connected with the SSD devices, thereby causing data bottleneck. Since the data bottleneck causes a decrease in the performance of the computing system, various techniques are being developed to improve the performance.

SUMMARY

Embodiments of the inventive concepts provide a memory module which makes it easy to back data up in a nonvolatile memory and an operating method thereof.

One aspect of embodiments of the inventive concept is directed to provide a memory system. The memory system includes a volatile memory device configured to exchange data with a host through a first channel, a nonvolatile memory device, and a memory controller connected with the volatile memory device through a second channel. The memory controller detects a request of the host or a power state and controls the volatile memory device and the nonvolatile memory device based on the detection result such that data stored in the volatile memory device is backed up in the nonvolatile memory device through the second channel. The volatile memory device includes a first interface for communicating with the host through the first channel and a second interface for communicating with the memory controller through the first channel.

Another aspect of embodiments of the inventive concept is directed to provide a memory module. The memory module includes a nonvolatile memory device, a DRAM including a first interface and a second interface independent of the first interface and used to back data up in the nonvolatile memory device, and a nonvolatile memory controller configured to activate, during a backup operation, the second interface and to program backup data provided from the DRAM at the nonvolatile memory device.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Below, embodiments of the inventive concept will be described in detail with reference to accompanying drawings. Detailed information such as detailed components and structures may be provided to help understanding embodiments of the inventive concept. Therefore, changes or modifications on embodiments disclosed in this specification may be variously made without departing from the scope and spirit of the inventive concept. In addition, a description about well-known functions and structures may be omitted for clarity and brevity. Terms used in this specification may be terms defined in the light of functions of the inventive concept and may not be limited to a specific function. Definition of terms may be determined based on information disclosed in the detailed description.

Modules in accompanying drawings or the detailed description may be with other things as well as components disclosed in the detailed description. Connection between modules or components may be directly or indirectly made. Connection between modules or components may be made through communication or may be a physical connection.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

A nonvolatile memory system according to some embodiments of the inventive concept may perform a flush operation in response to an activated save signal. While the flush operation is performed, the nonvolatile memory system may maintain an active state of the save signal. After the flush operation is terminated, the nonvolatile memory system may inactivate the save signal. Based on the inactivation of the save signal, a processor connected with the nonvolatile memory system may recognize that the flush operation of the nonvolatile memory system is completed. This may mean that the performance and reliability of the nonvolatile memory system is improved.

Figure 1:
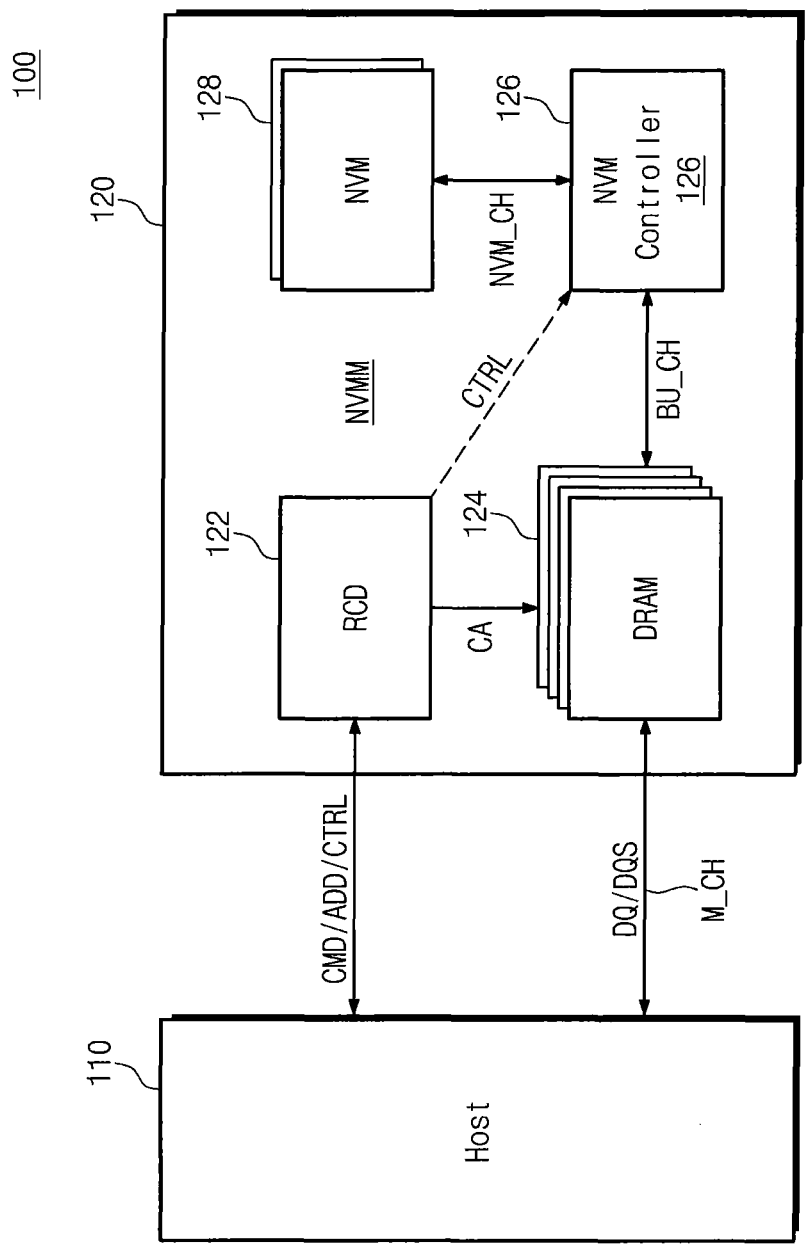
FIG. 1 is a block diagram illustrating a user device according to some embodiments of the inventive concept.

FIG. 1 is a block diagram illustrating a user device according to some embodiments of the inventive concept. Referring to FIG. 1, a user device 100 may include a host 110 and a nonvolatile memory module 120.

The host 110 may process data or may control components included in the user device 110. For example, the host 110 may drive various operating systems and may execute various applications on an operating system. The host 110 may store data in the nonvolatile memory module 120 or may read data therefrom.

The host 110 may request the nonvolatile memory module 120 to perform a backup operation. For example, the host 110 may detect a status or a power status of the host and may request the nonvolatile memory module 120 to perform a backup operation. The host 110 may request the nonvolatile memory module 120 to perform a backup operation by using a command/address sequence. In some embodiments, the host 110 may request the nonvolatile memory module 120 to perform a backup operation by using a control signal CTRL. In addition, the host 119 may request a backup operation of the nonvolatile memory module 120 using data DQ provided through a data bus or using a separate serial interface.

The nonvolatile memory module 120 may store data in a DRAM 124 or in a nonvolatile memory 128 in response to a request of the host 110. The nonvolatile memory module 129 may back data stored in the DRAM 124 up in the nonvolatile memory 128 in response to a request of the host 110 or through a power status internally detected by the nonvolatile memory module 120. To this end, the nonvolatile memory module 120 may include a registering clock driver (hereinafter referred to as "RCD") 122, the DRAM 124, a NVM controller 126, and the nonvolatile memory 128.

The RCD 122 may buffer a command or an address which the host 110 provides. The buffered command or address may be provided to the DRAM 124. Although not shown, the RCD 122 may sequentially provide a command to a data buffer DB, which is placed in front of the DRAM 124, if needed. The RCD 122 may buffer a control signal CTRL provided from the host 110 and may provide the buffered control signal to the DRAM 124 or a target device. For example, in some embodiments, the RCD 122 may transmit a backup control signal SAVE_n provided from the host 110 to the NVM controller 126.

The DRAM 124 may exchange data with the host 110 through a main channel M_CH. In addition, the DRAM 124 may exchange data with the host 110 through a backup channel BU_CH. During a normal operation, the DRAM 124 may receive or output data from or to the host 110 through the main channel M_CH. The main channel M_CH may include, for example, signal lines for transmitting a data signal DQ and a data strobe signal DQS. The backup channel BU_CH may include, for example, signal lines for transmitting a data signal DQ' and a data strobe signal DQS', independently of the main channel M_CH.

In some embodiments, the main channel M_CH may include at least one of double data rate (DDR), DDR2, DDR3, DDR4, low power DDR (LPDDR), universal serial bus (USB), multimedia card (MMC), embedded MMC, peripheral component interconnection (PCI), PCI-express (PCI-E), advanced technology attachment (ATA), serial- ATA, parallel-ATA, small computer small interface (SCSI), enhanced small disk interface (ESDI), integrated drive electronics (IDE), firewire, universal flash storage (UFS), nonvolatile memory express (NVMe), or the like. The backup channel BU_CH may include at least one of an inter-Integrated circuit (I2C) bus, a universal asynchronous receiver transmitter (UART) bus, a serial peripheral interface (SPI), a controller area network (CAN) bus, and/or a system management bus (SMBUS).

The NVM controller 126 may determine whether there is a need to back up data stored in the DRAM 124. The necessity of the backup operation may be provided to the NVM controller 126 using a control signal CTRL or a command from the host 110. In some embodiments, the NVM controller 126 may determine whether the backup operation is required, by monitoring a level of a voltage provided to the nonvolatile memory module 120. If the backup operation starts, the NVM controller 126 may provide the DRAM 124 with a read command about data to be backed up, through the backup channel BU_CH. The NVM controller 126 may receive backup data provided from the DRAM 124 through the backup channel BU_CH. Afterwards the backup data may be programmed at the nonvolatile memory 128.

The nonvolatile memory 128 may be connected with the NVM controller 126 through an NVM channel NVM_CH. The nonvolatile memory device 128 may include, for example, one or more flash memories. Under control of the NVM controller 126, the nonvolatile memory 128 may store backup data or may output the data backed up. In some embodiments, the nonvolatile memory 128 may be implemented with nonvolatile memory elements such as electrically erasable and programmable ROM (EEPROM), NAND flash memory, NOR flash memory, phase-change RAM (PRAM), resistive RAM (ReRAM), ferroelectric RAM (FRAM), spin-torque magnetic RAM (STT-MRAM), and the like. For descriptive convenience, it may be assumed that the nonvolatile memory 128 is a NAND flash memory.

In some embodiments of the inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In some embodiments of the inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

According to the above-described user device 100, the nonvolatile memory module 120 may include the DRAM 124 which has the main channel M_CH for data exchange with the host 110 and the backup channel BU_CH for a transfer of the backup data. During a normal operation, the DRAM 120 may exchange data with the host 110 through the main channel M_CH. The nonvolatile memory module 120 may recognize an event such as occurrence of a power error through a control of the host 110 or through internal monitoring and may back data loaded onto the DRAM 124 up in the nonvolatile memory 128.

In some embodiments, although not shown, the nonvolatile memory module 120 may have the form of a dual in-line memory module (DIMM) and may be mounted on a DIMM socket electrically or directly connected with the host 110. In some embodiments, the user device 100 may include one of a computer, a portable computer, a ultra-mobile personal computer (UMPC), a workstation, a server computer, a net-book, a personal digital assistant (PDA), a portable computer, a web tablet, a wireless phone, a mobile phone, a smartphone, a digital camera, a digital audio recorder, a digital audio player, a digital picture recorder, a digital picture player, a digital video recorder, a digital video player, a device capable of transmitting or receiving information in a wireless environment, and/or various electronic devices including a home network.

Figure 2:
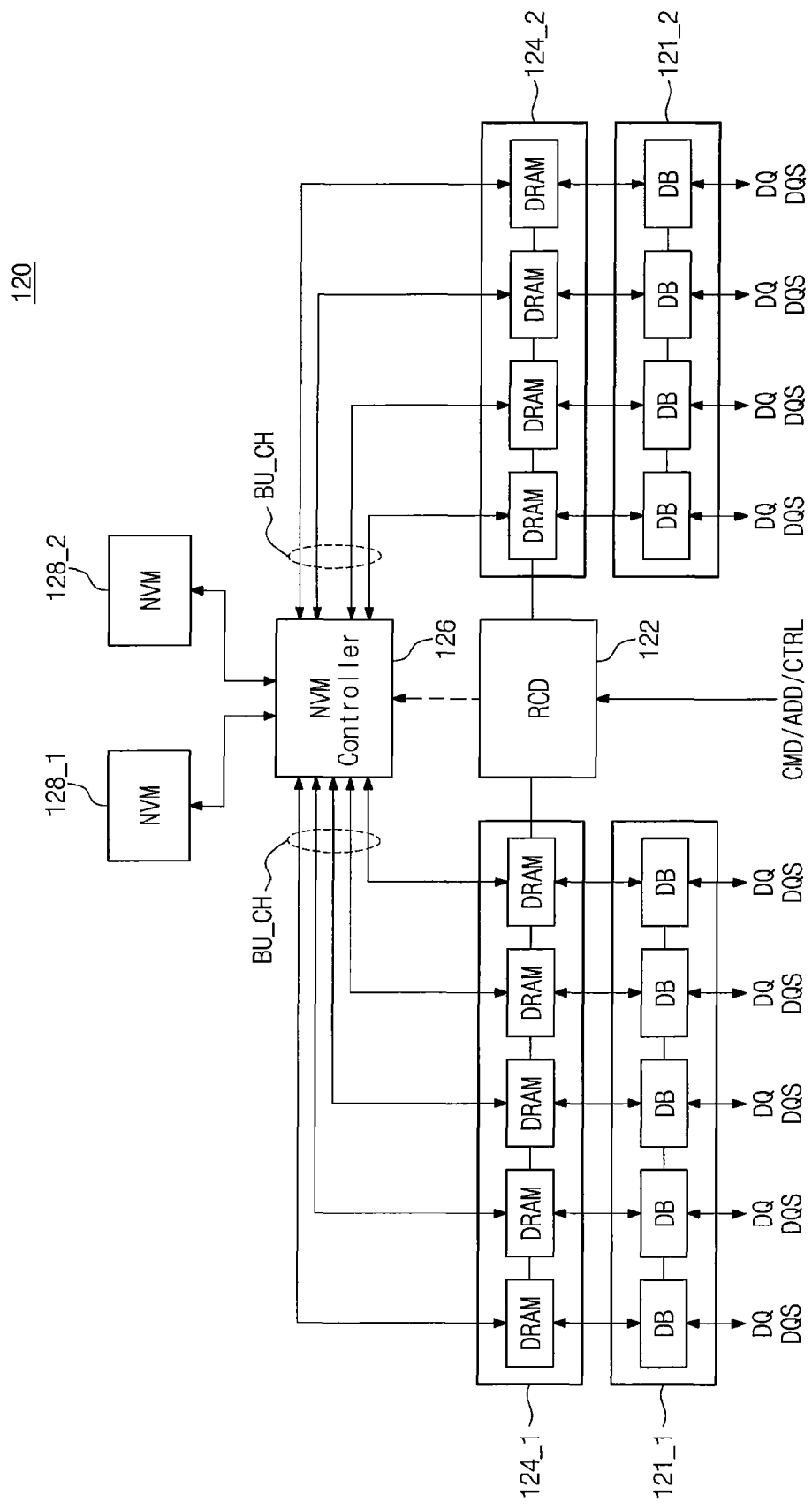
FIG. 2 is a block diagram schematically illustrating a nonvolatile memory module illustrated in FIG. 1.

FIG. 2 is a block diagram schematically illustrating a nonvolatile memory module illustrated in FIG. 1. Referring to FIG. 2, the nonvolatile memory module 120 may include an RCD 122, a plurality of DRAMs 124_1 to 124_2, the NVM controller 126, and a nonvolatile memory (128_1, 128_2). The nonvolatile memory module 120 may further include a data buffer (121_1, 121_2) between the DRAMs 124_1 and 124_2 and the host 110.

The RCD 122 may transfer a command, an address, or a control signal CTRL from the host 110 to the DRAMs 124_1 and 124_2. The DRAMs 124_1 and 124_2 may perform data exchange with the host 119 in response to the command, address, and control signal from the RCD 122. The DRAMs 124_1 and 124_2 may exchange a data signal DQ and a data strobe signal DQS through the data buffers 121_1 and 121_2 respectively disposed between the DRAMs 124_1 and 124_2 and the host 110. Although not shown, the RCD 122 may provide a command for controlling the data buffers 121_1 and 121_2.

The NVM controller 126 may activate a backup operation in response to a control of the host 119 or through a result monitored by the NVM controller 126. Information indicating a backup operation through a command or a control signal from the host 110 or through various manners may be provided to the NVM controller 126 through the RCD 122 or directly. The nonvolatile memory module 120 may automatically detect a power supply voltage supplied thereto to monitor occurrence of a power error. If the backup operation is activated, the NVM controller 126 may direct at least one of the DRAMs 124_1 and 124_2 to output backup data through the backup channel BU_CH. If the backup operation is activated, the NVM controller 126 may receive data from the at least one of the DRAMs 124_1 and 124_2 through the backup channel BU_CH. Afterwards, the received backup data may be programmed at the nonvolatile memory (128_1, 128_1).

According to the above-described nonvolatile memory module 120, the DRAMs 124_1 and 124_2 may include the main channel M_CH for data exchange with the host 110 and the backup channel BU_CH for backup. In addition, the nonvolatile memory module 120 may operate as a DRAM module during a normal operation; if a power is removed or a power error occurs, the nonvolatile memory module 120 may back data being used up in the nonvolatile memory (128_1, 128_2). With the above description, the nonvolatile memory module 120 may operate like a DRAM module accessible in high speed, and the nonvolatile memory module 120 may retain data being driven even when a power is removed (i.e., a nonvolatile characteristic).

Figure 3:
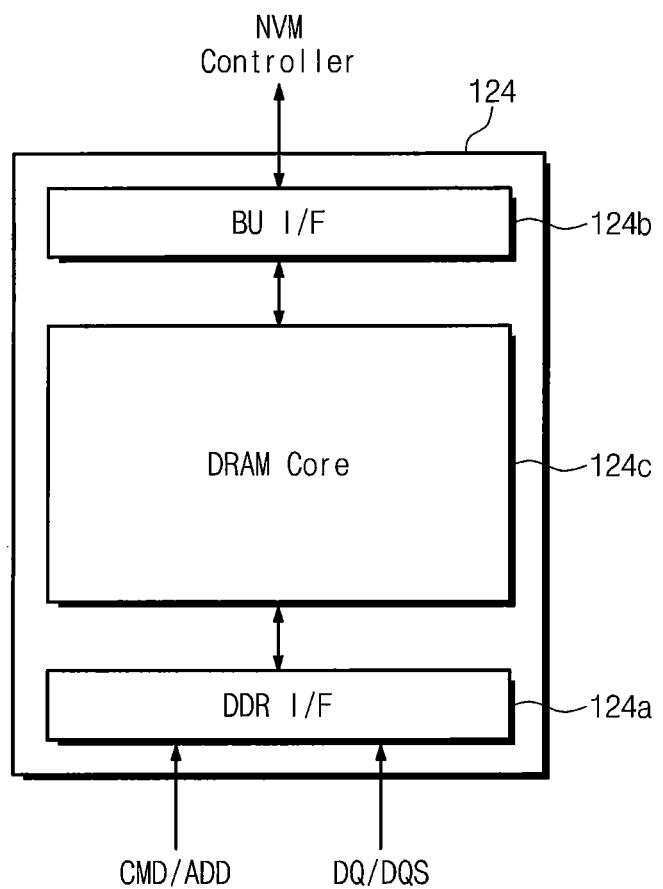
FIG. 3 is a block diagram schematically illustrating a structure of a DRAM according to some embodiments of the inventive concept.

FIG. 3 is a block diagram schematically illustrating a structure of a DRAM according to some embodiments of the inventive concept. Referring to FIG. 3, a DRAM 124 may include a double data rate (DDR) interface 124a, a backup interface 124b, and a DRAM core 124c.

The DRAM core 124c may include a cell array for storing data and components for writing or sensing data at or from the cell array. In addition, register sets for various operations may be included in the DRAM core 124c.

The DDR interface 124a may be an interface for data exchange between the DRAM 124 and the host 110. The DDR interface 124a may decode and process a command, an address, and a control signal from the host 110. The DRAM 124 may receive a data signal DQ and a data strobe signal DQS from the host 110 through the DDR interface 124a. Furthermore, the DRAM 124 may output the data signal DQ or the data strobe signal DQS to the host 110 through the DDR interface 124a.

The backup interface 124b may be used for data exchange with the NVM controller 126. The DRAM 124 may receive a data read command and an address for the backup operation from the NVM controller 128 through the backup interface 124b. Data read from the PRAM core 124c for backup may be provided to the NVM controller 126 through the backup interface 124b.

Here, an input/output signal driven by the backup interface 124b may be processed through a serial communication manner in which a signal is transmitted in both directions. However, a signal manner for generating an input/output signal of the backup interface 124b may be the same as a signal manner for generating an input/output signal of the DDR interface 124a. For example, the signal manner of the backup interface 124b may be the same as that of the DDR interface 124a. That is, the signal manner of the backup interface 124b may be a pseudo open drain (POD) manner. However, the scope and spirit of the inventive concept may not be limited thereto.

A bandwidth for data transmission of the backup interface 124b may be set to be different from that of the DDR interface 124a for data exchange with the host 110. The bandwidth of the backup interface 124b may be designed according to a time taken to back up data or according to the performance of an auxiliary power device for backup. For example, the activation of the backup interface 124b may be made at the same time with the activation of the DDR interface 124a. Accordingly, the DDR interface 124a and the backup interface 124b may operate in a dual port manner and may input and output a command and data. In some embodiments, the activation of the backup interface 124b may be made at a point in time (e.g., idle) when the DDR interface 124a is inactivated. That is, it may be possible to set the DRAM 124 such that one of the DDR interface 124a and the backup interface 124b is activated.

Figure 4:
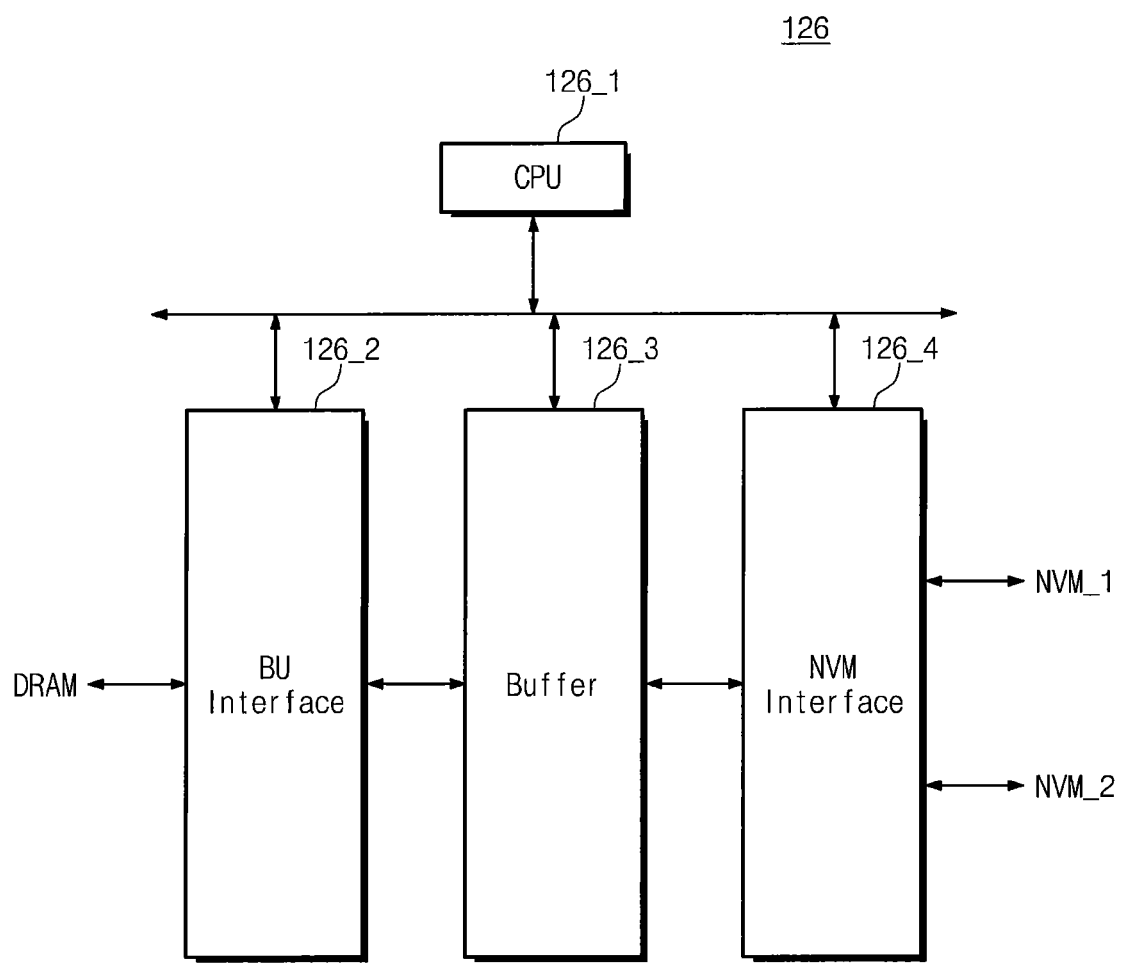
FIG. 4 is a block diagram schematically illustrating a NVM controller according to some embodiments of the inventive concept.

FIG. 4 is a block diagram schematically illustrating a NVM controller 126 according to some embodiments of the inventive concept. Referring to FIG. 4, the NVM controller 126 may include a central processing unit (CPU) 126_1, a host interface 126_2, a buffer 126_3, and a NVM interface 126_4.

The CPU 126_1 may drive firmware or software for driving the NVM controller 126. For example, the CPU 126_1 may run firmware for performing functions, such as data exchange, error correction, scrambling, and the like, executed in the NVM controller 126. In particular, for a backup operation, the CPU 126_1 may refer to a control signal from the host 110 or a result of internally monitoring a power. In some embodiments, if the backup operation is selected, the CPU 126_1 may request backup data from the DRAM 124 using the backup interface 126_2. Backup data from the DRAM 124 may be stored in the buffer 126_3 through the backup interface 126_2. The backup data stored in the buffer 126_3 may be programmed at the nonvolatile memory (128_1, 128_2) selected by the NVM interface 126_4.

In contrast, the CPU 126_1 may load the backed up data onto the DRAM 124 from the nonvolatile memory (128_1, 128_2). During a booting or reset operation, the CPU 126_1 may load the backed up data onto the DRAM 124 with a state before backup, based on a specific procedure. In this case, a data flow may be reverse to that of a backup operation. It may be understood that the CPU 126_1 is implemented with a multi-core for performing the above-described control operation.

Figure 5:
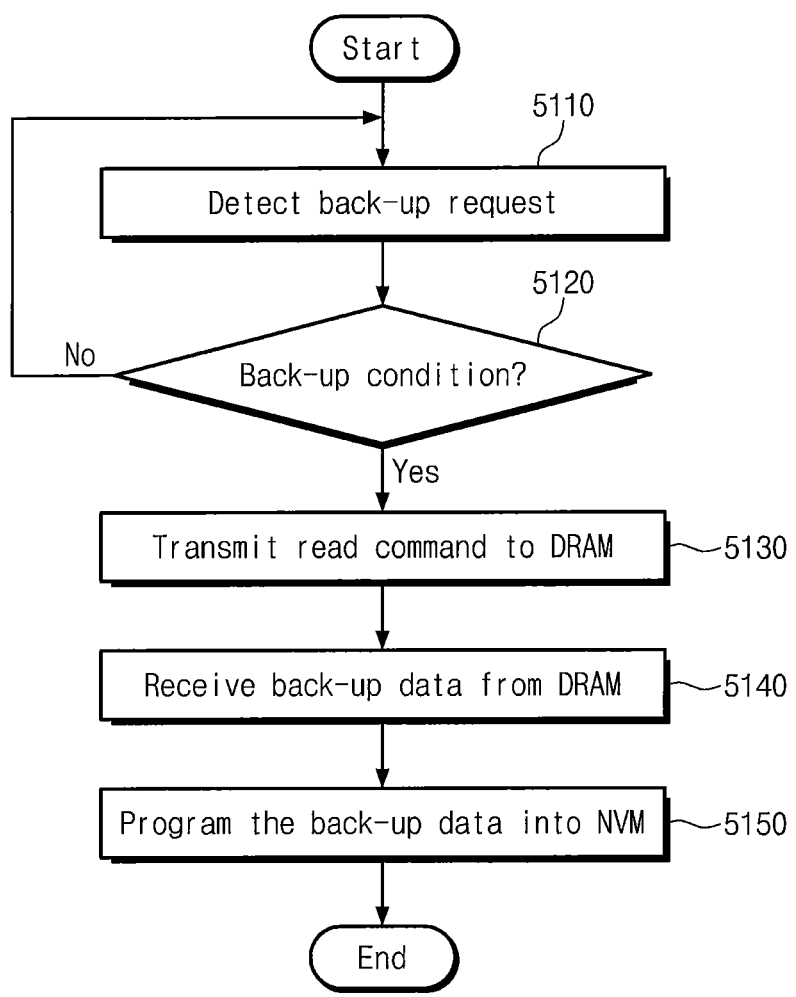
FIG. 5 is a flow chart schematically illustrating methods for performing a backup operation of an NVM controller of FIG. 1 or 4.

FIG. 5 is a flow chart schematically illustrating methods for performing a backup operation of an NVM controller 126 of FIG. 1 or 4. Referring to FIG. 5, the NVM controller 126 may communicate with the DRAM 124 through the backup channel BU_CH for a backup operation.

In operation 5110, the NVM controller 126 may determine whether to need to back up data stared in the DRAM 124. For example, the NVM controller 126 may start a backup operation based on a command or a control signal from the host 110 or various internal information. In some embodiments, the NVM controller 126 may detect a backup request by monitoring a status of a power provided to the nonvolatile memory module 120.

In operation 5120, the NVM controller 126 may determine whether a backup condition is satisfied, and an operation of the NVM controller 126 may branch according to the determination result. If the backup condition is determined as being satisfied, the procedure may proceed to operation 5130. If the backup condition is not satisfied, the procedure may proceed to operation 5110.

In operation 5130, the NVM controller 126 may transmit a read command for backup to the DRAM 124 through the backup channel BU_CH. In this case, the NVM controller 126 may transmit a command and an address such that only a part of data loaded onto the DRAM 124 is selectively backed up. Some embodiments provide that the NVM controller 126 may provide a command and an address for backing all data loaded onto the DRAM 124 up in the nonvolatile memory 128.

In operation 5140, the NVM controller 126 may receive data outputted from the DRAM 124 through the backup channel BU_CH. In response to the read command, the DRAM 124 may output backup data to the backup channel BU_CH by the page or sequentially. However, it may be understood that the transfer size of backup data is not limited thereto. That is, the size of backup data transmitted to the NVM controller 126 from the DRAM 124 may be smaller or greater than the size of one page.

In operation 5150, the NVM controller 126 may program the backup data provided from the DRAM 124 at the nonvolatile memory 128.

Some embodiments of the inventive concept are exemplified as the NVM controller 126 communicates with the DRAM 124 through the backup channel BU_CH for the backup operation. The bandwidth of the backup channel BU_CH activated during the backup operation may be different from that of the main channel M_CH used to exchange data with the host 110. The reason is that no problem may occur if the bandwidth for backup data transferred between the DRAM 124 and the NVM controller 126 is greater than or equal to the bandwidth for data transferred between the DRAM 124 and the NVM controller 126.

Figure 6:
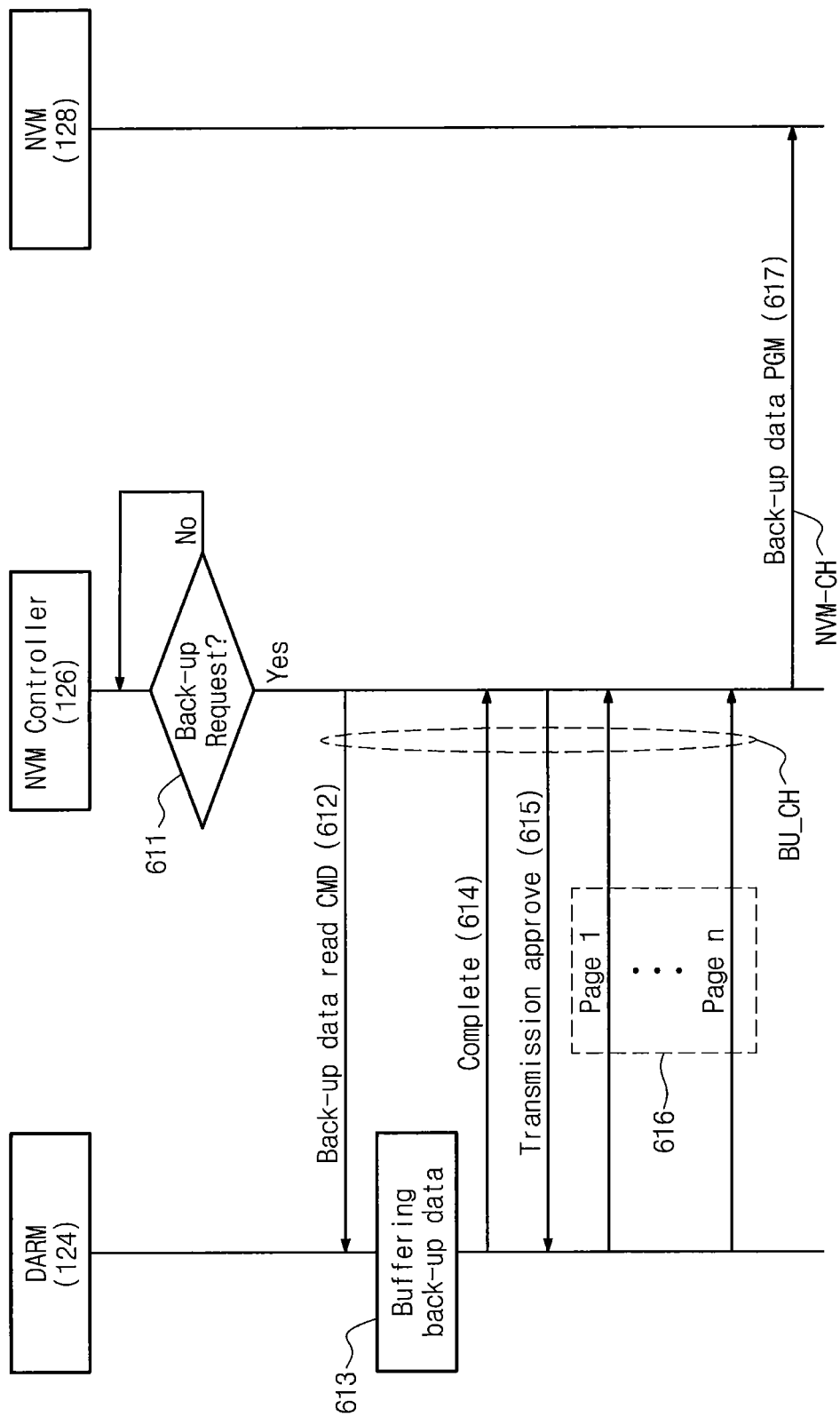
FIG. 6 is a diagram schematically illustrating a backup operation of a nonvolatile memory module according to some embodiments of the inventive concept.

FIG. 6 is a diagram schematically illustrating a backup operation of a nonvolatile memory module according to some embodiments of the inventive concept. Referring to FIG. 6, a command, an address, and data of a page unit may be exchanged between the NVM controller 126 and the DRAM 124 through the backup channel BU_CH.

In operation 611, the NVM controller 126 may determine whether a backup operation is required. For example, in some cases, the host 110 may request the nonvolatile memory module 120 to perform a backup operation by using a control signal SAVE_n or a command. In some embodiments, the NVM controller 126 may determine whether the backup operation is required, by monitoring a status of a power supply voltage. If the backup operation is determined as not being required, the NVM controller 126 may continue to monitor the necessity of the backup operation. If the backup operation is determined as being required, the NVM controller 126 may provide a read command, an address, and the like to the DRAM 124.

In operation 612, the NVM controller 126 may transmit a read command for backup to the DRAM 124 through the backup channel BU_CH. The NVM controller 126 may transmit the read command and an address through the backup channel BU_CH and may hand the authority of the backup channel BU_CH over to the DRAM 124.

In operation 613, the DRAM 124 may sense and buffer read-requested backup data. In operation 614, the DRAM 124 may notify the NVM controller 126 to be ready to output the read-requested data through the backup channel BU_CH. In operation 615, the NVM controller 126 may acknowledge a transfer of the backup data.

In operation 616, the DRAM 124 may transmit the backup data through the backup channel BU_CH by the page. In the case where the backup channel BU_CH is serial, the backup data may be transmitted to the NVM controller 126 from the DRAM 124 in a serial manner in synchronization with a clock CLK. In some embodiments, the backup data may be transmitted to the NVM controller 126 in synchronization with a data strobe signal DQS. An embodiment of the inventive concept is exemplified as data is transmitted by the page. However, the scope and spirit of the inventive concept may not be limited thereto. For example, the backup data may be transmitted by a data unit smaller than or greater than a page unit.

In operation 617, the backup data transmitted to the NVM controller 126 may be programmed at the nonvolatile memory 128. The NVM controller may rearrange, for example, data of a page unit based on a format corresponding to a NVM channel NVM_CH and may program the rearranged data at the nonvolatile memory 128.

Operations a the DRAM 124, the NVM controller 126, and the nonvolatile memory 128 are described with regard to the backup operation. However, the scope and spirit of the inventive concept may not be limited thereto. For example, for reliability of data, error correction or CRC parity may be applied to backup data transmitted from the DRAM 124 during the backup operation.

Figure 7:
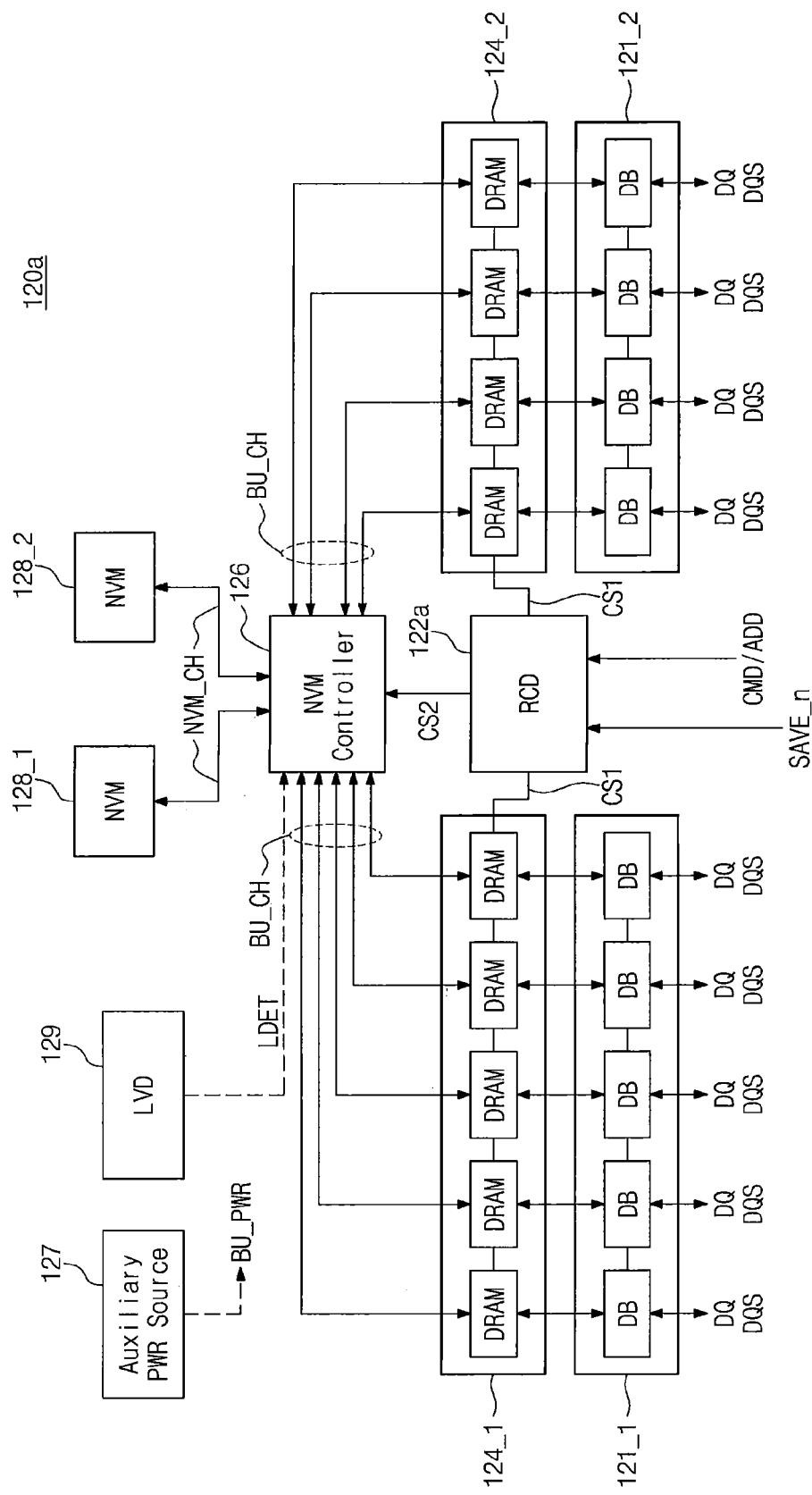
FIG. 7 is a block diagram schematically illustrating a nonvolatile memory module illustrated in FIG. 1, according to some other embodiments of the inventive concept.

FIG. 7 is a block diagram schematically illustrating a nonvolatile memory module illustrated in FIG. 1, according to another embodiment of the inventive concept. Referring to FIG. 7, a nonvolatile memory module 120a may include the RCD 122a, the DRAMs 124_1 to 124_2, the NVM controller 126, and the nonvolatile memory (128_1, 128_2). As illustrated in FIG. 7, the nonvolatile memory module 120a may further include a data buffer (121_1, 121_2) between the DRAMs 124_1 and 124_2 and the host 110, an auxiliary power source 127 for backup, and a low-voltage detector 129. The DRAMs 124_1 and 124_2 and the nonvolatile memory (128_1, 128_2) may be substantially the same as those of FIG. 2, and a detailed description thereof is thus omitted.

The RCD 122a may transfer a command, an address, and/or a control signal CTRL received from the host 110 to the DRAMs 124_1 and 124_2. The command, address and/or control signal CTRL provided to the DRAMs 124_1 and 124_2 may be illustrated as being a first control signal CS1. In particular, when receiving a control signal SAVE_n from the host 110, the RCD 122a may notify the NVM controller 126 that a backup operation is required. In FIG. 7, a control signal provided to the NVM controller 126 may be illustrated as being a second control signal CS2.

The NVM controller 126 may activate the backup operation in response to a control of the host 110 or through an automatic monitoring operation. Information indicating a backup operation through a command or a control signal from the host 110 or through various manners may be provided to the NVM controller 126 through the RCD 122a or directly. The nonvolatile memory module 120 may automatically detect a power supply voltage supplied thereto to monitor occurrence of a power error. If the backup operation is activated, the NVM controller 126 may receive backup data from at least one of the DRAMs 124_1 and 124_2 through the backup channel BU_CH. The NVM controller 126 may store data from the at least one DRAM in the nonvolatile memory (128_1, 128_1).

According to the above-described nonvolatile memory module 120a, the DRAMs 124_1 and 124_2 may include the main channel M_CH for data exchange with the host 110 and the backup channel BU_CH for backup. In addition, at a normal operation, the nonvolatile memory module 120a may operate the same as a DRAM module. In the case where a power error occurs, however, the nonvolatile memory module 120a may back a part or all of data loaded onto the at least one DRAM up in the nonvolatile memory (128_1, 128_2), based on a request of the host 110 or internal determination. Accordingly, at a normal operation, the nonvolatile memory module 120a may operate as a working memory accessible in high speed. However, the nonvolatile memory module 120a may have a nonvolatile characteristic to retain data loaded onto the DRAMs 124_1 and 124_2 if a power is removed therefrom.

Figure 8:
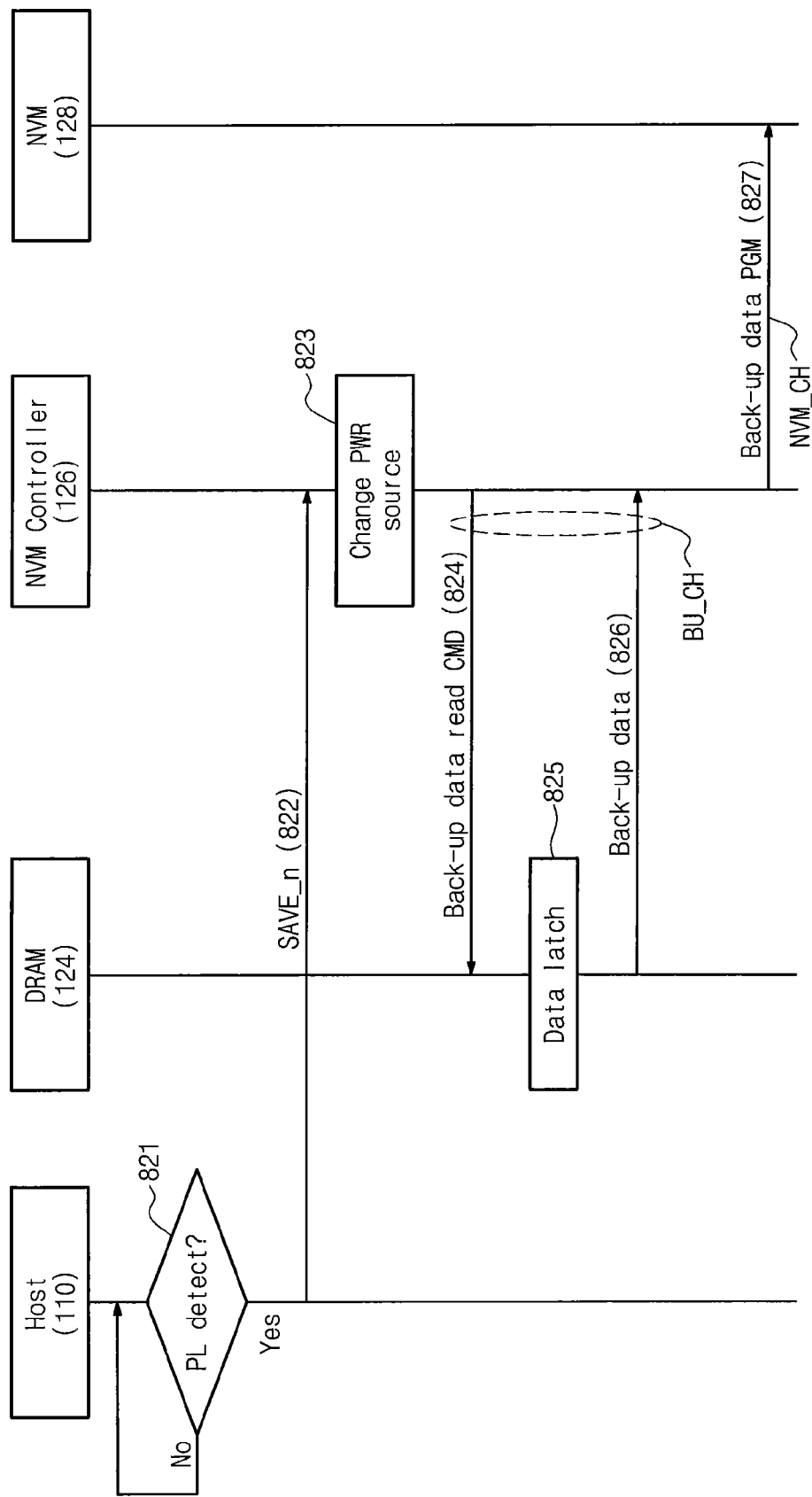
FIG. 8 is a flow chart schematically illustrating a backup operation of a nonvolatile memory module of FIG. 7 performed according to a request of a host.

FIG. 8 is a flow chart schematically illustrating a backup operation of a nonvolatile memory module of FIG. 7 performed according to a request of a host. Referring to FIG. 8, the NVM controller 126 may start a backup operation in response to a command or a control signal from the host 110 or various hint information.

In operation 821, the host 110 may detect power loss (PL) or power failure by monitoring a power state of the user device 100. If the power failure or the power loss is detected, in operation 822, the host 110 may transmit a control signal (e.g., SAVE_n) to the nonvolatile memory module 120a. In some embodiments, the control signal SAVE_n may be provided to the NVM controller 126 through the RCD 122a. In some embodiments, the host 110 may provide hint information for backup using a command or any other signal, not the control signal.

In operation 823, the NVM controller 126 may switch from a power for driving the nonvolatile memory module 120a to an auxiliary power BU_PWR for a backup operation from the auxiliary power source 127. The auxiliary power source 127 may be a component such as a super capacitor. The auxiliary power source 127 may be charged by a power from the host 110 at a normal operation and may discharge a power at the backup operation. A power from the auxiliary power source 127 may be provided to components used for the backup operation such as the DRAMs 124_1 and 124_2, the NVM controller 126, and the nonvolatile memory (128_1, 128_2).

In operation 824, the NVM controller 126 may provide a read command, an address and the like for backup to the DRAMs 124_1 and 124_2 driven by the auxiliary power source 127. The read command may be provided through the backup channel BU_CH.

In operation 825, at least one of the DRAMs 124_1 and 124_2 may perform a sensing operation for reading data from a cell array thereof in response to the read command. In operation 826, the at least one of the DRAMs 124_1 and 124_2 may output the sensed backup data to the NVM controller 126 through the backup channel BU_CH. As described above, the backup data may be transmitted to the NVM controller 126 by a page unit or a unit smaller or greater than the page unit.

In operation 827, the NVM controller 126 may program the backup data provided from the at least one DRAM at the nonvolatile memory (128_1, 128_2).

An embodiment of the inventive concept is exemplified as a backup operation of the nonvolatile memory module 120a is performed using a control signal, a command, or the like provided from the host 110.

Figure 9:
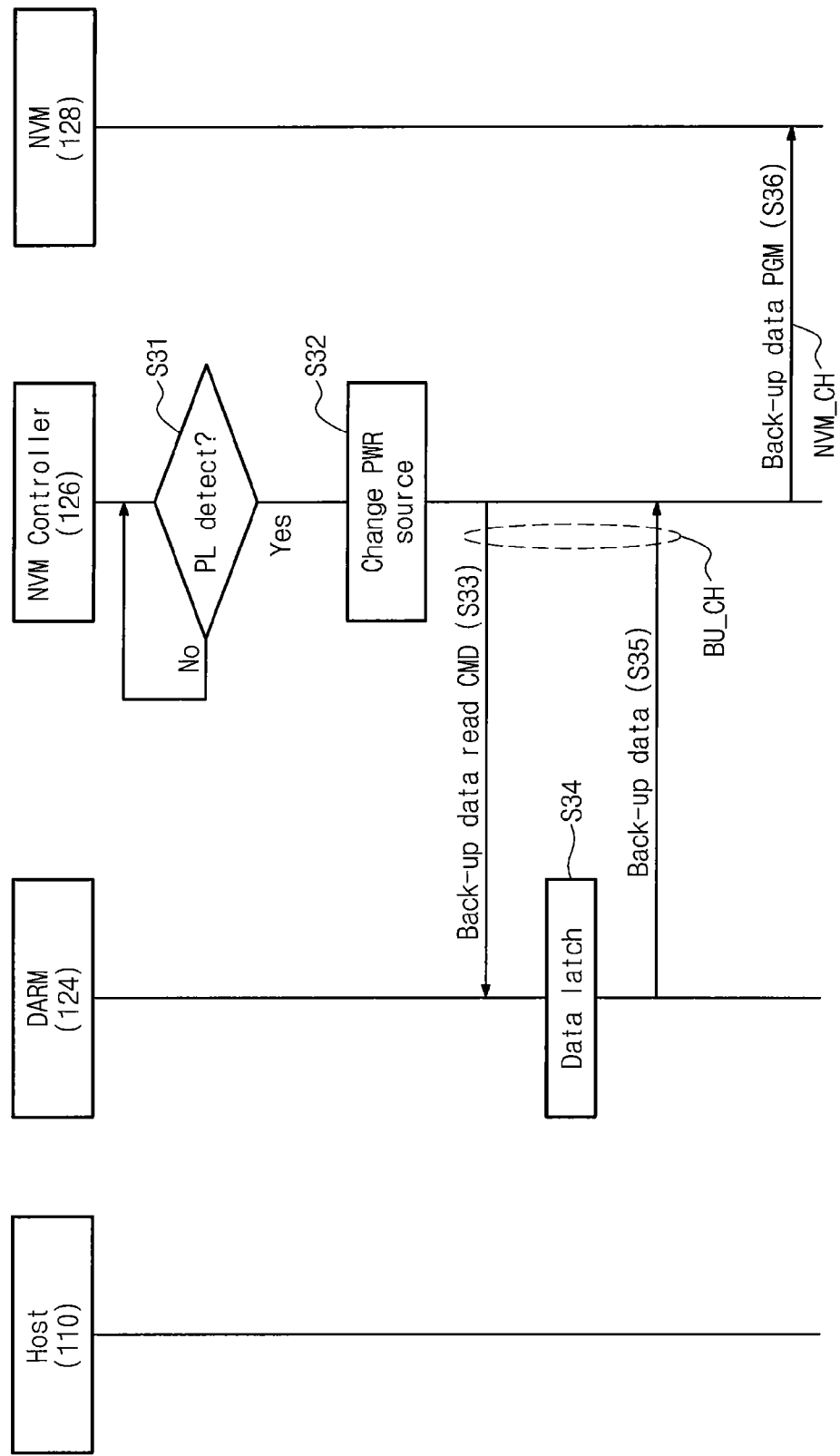
FIG. 9 is a flow chart schematically illustrating a backup operation of a nonvolatile memory module of FIG. 7 performed according to internal determination.

FIG. 9 is a flow chart schematically illustrating a backup operation of a nonvolatile memory module of FIG. 7 performed according to internal determination. Referring to FIG. 9, the NVM controller 126 may start a backup operation based on a detection result of the low-voltage detector 129 included in the nonvolatile memory module 120a.

In operation 931, the NVM controller 126 may monitor a low-voltage detection signal LDET provided from the low-voltage detector 129. If detecting a state where the low-voltage detection signal LDET is lower than a reference level, the NVM controller 126 may recognize such a state as power failure or power loss. If the power failure or the power loss is detected, the procedure may proceed to operation 932.

In operation 932, the NVM controller 126 may switch from a previous power for driving the nonvolatile memory module 120a to an auxiliary power BU_PWR for a backup operation from the auxiliary power source 127.

If the power change is completed, in operation 933, the NVM controller 126a may provide a read command, an address and the like for backup to the DRAMs 124_1 and 124_2 which remain backup data using the auxiliary power BU_PWR from the auxiliary power source 127. The read command, the address, and the like may be provided to the DRAMs 124_1 and 124_2 through the backup channel BU_CH. In operation 934, each of the DRAMs 124_1 and 124_2 may perform a sensing operation for reading data from a cell array thereof in response to the read command. In operation 935, each of the DRAMs 124_1 and 124_2 may output the sensed backup data to the NVM controller 126 through the backup channel BU_CH. As described above, the backup data may be transmitted to the NVM controller 126 by a page unit or a unit smaller or greater than the page unit. In operation 936, the NVM controller 126 may program the backup data provided from the at least one DRAM at the nonvolatile memory (128_1, 128_2).

Some embodiments of the inventive concept are exemplified as a backup operation is performed according to a result of detecting a power state in the nonvolatile memory module 120a. For the reliability of the above-described backup operation, the nonvolatile memory module 120a may include an auxiliary power source sufficient to perform the above-described backup procedure.

Figure 10:
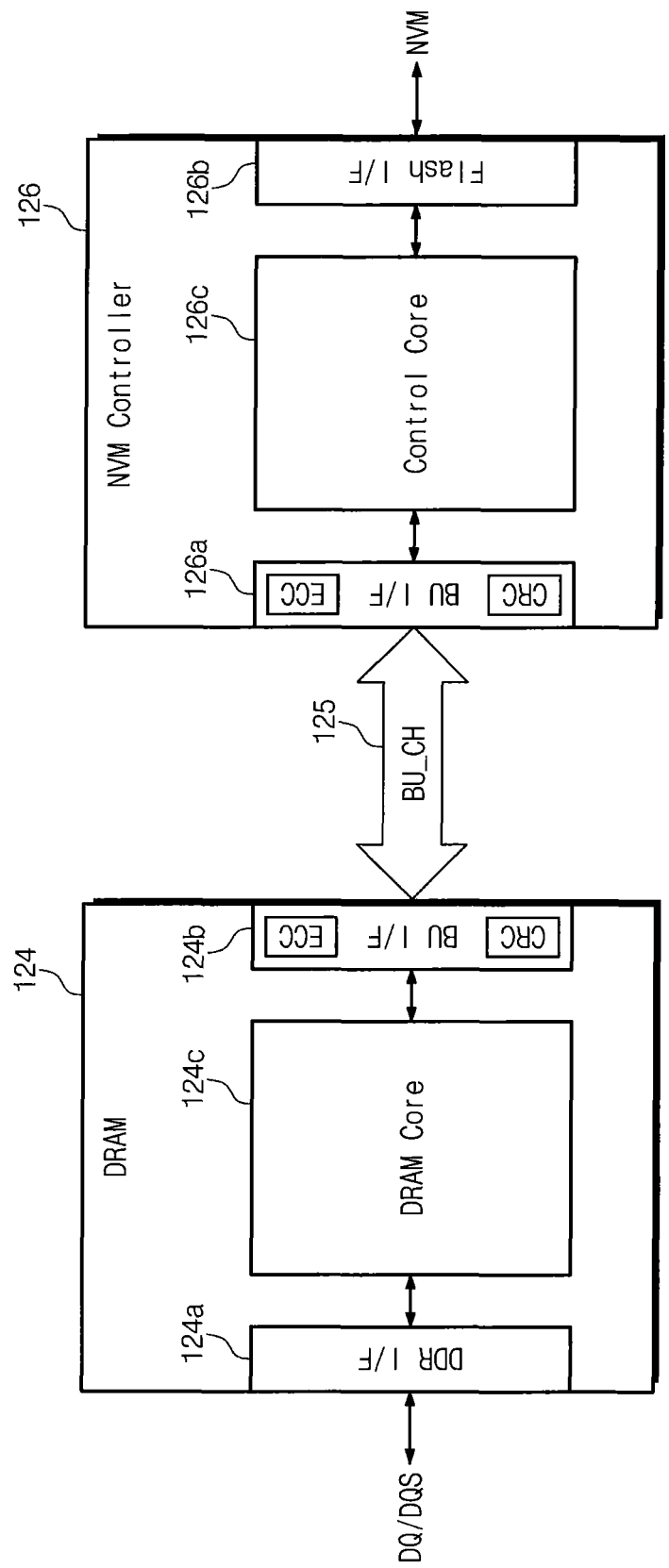
FIG. 10 is a block diagram schematically illustrating a DRAM and a NVM controller having a backup channel according to some embodiments of the inventive concept.

FIG. 10 is a block diagram schematically illustrating a DRAM and a NVM controller having a backup channel according to some embodiments of the inventive concept. Referring to FIG. 10, a DRAM 124 may include a backup interface 124b for a backup operation which is independent of a DDR interface 124a for communicating with the host 110.

The DRAM 124, as described above, may include the DDR interface 124a for an interface with the DRAM core 124c and the backup interface 124b. In particular, the backup interface 124b may include a component for providing an error correction code (ECC) or a cyclic redundancy checking (CRC) code to backup data. Since data backup is made using an abnormal auxiliary power, the reliability about backup data may be improved by applying an error correction or error detection function to the backup data.

The NVM controller 126 may include a backup interface 126a for communication with the DRAM 124 and a flash interface 126b for communication with the nonvolatile memory 128. A control core 126c may control whether to start a backup operation, a request of backup data, writing of backup data at the nonvolatile memory 128, and the like.

Furthermore, the NVM controller 126 may include a component for detecting whether backup data provided through a backup channel 125 includes an error or an error correction (ECC) or error detection (CRC) engine capable of correcting a detected error. The ECC or CRC engine may be included in the backup interface 126a of the NVM controller 126. If there is detected that the backup data includes an error, the NVM controller 126 may again request the backup data from the DRAM 124. In some embodiments, if it is detected that the backup data includes an error, the NVM controller 126 may correct correctable error bits using the ECC engine and may store the corrected data in the nonvolatile memory 128.

Figure 11A:
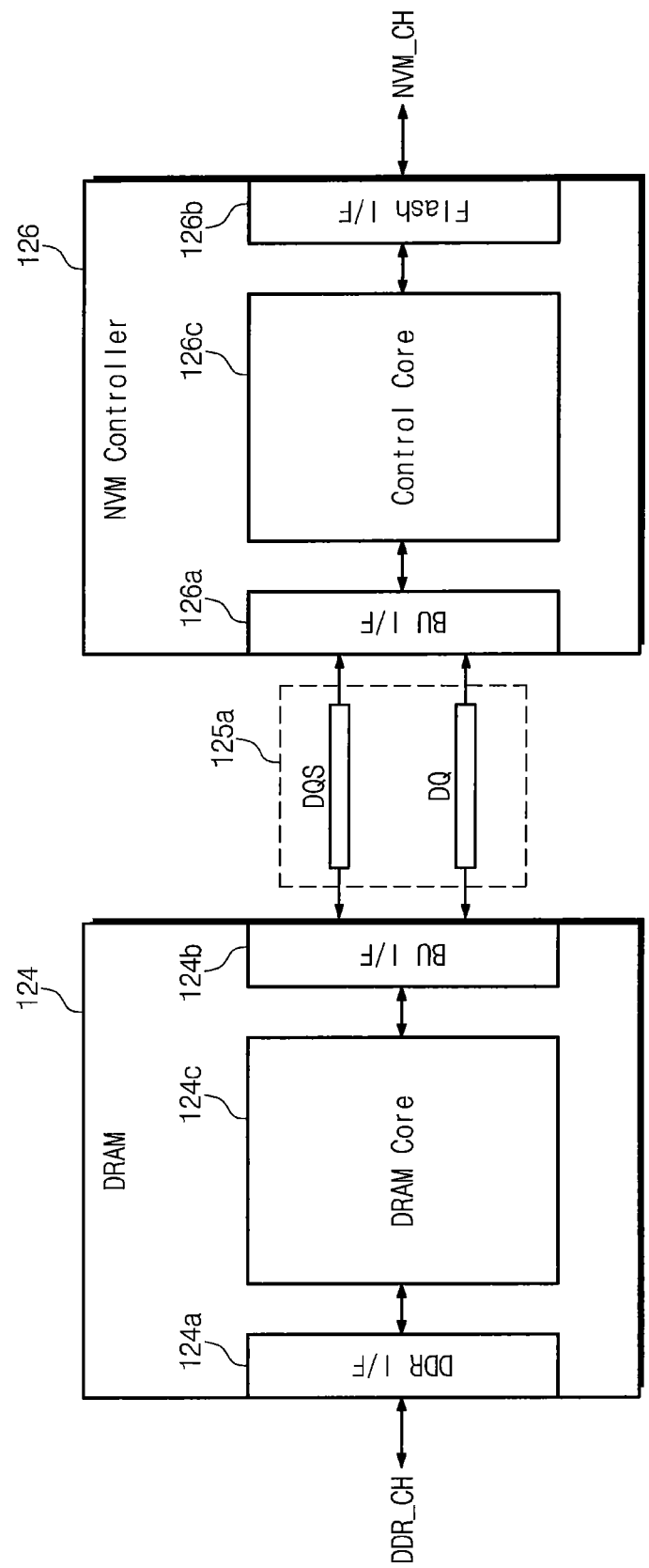
FIGS. 11A to 11C are diagrams schematically illustrating a backup channel according to various embodiments of the inventive concept.
Figure 11B:
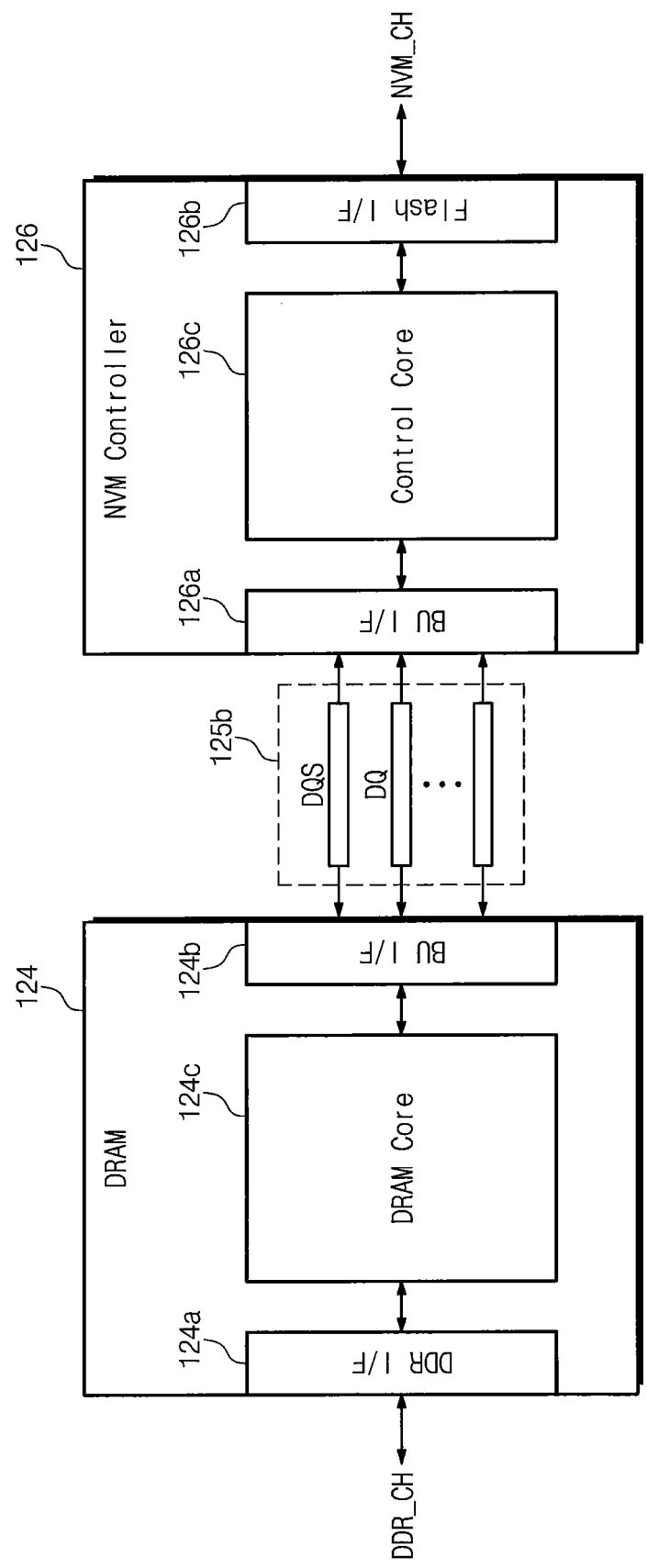
Figure 11C:
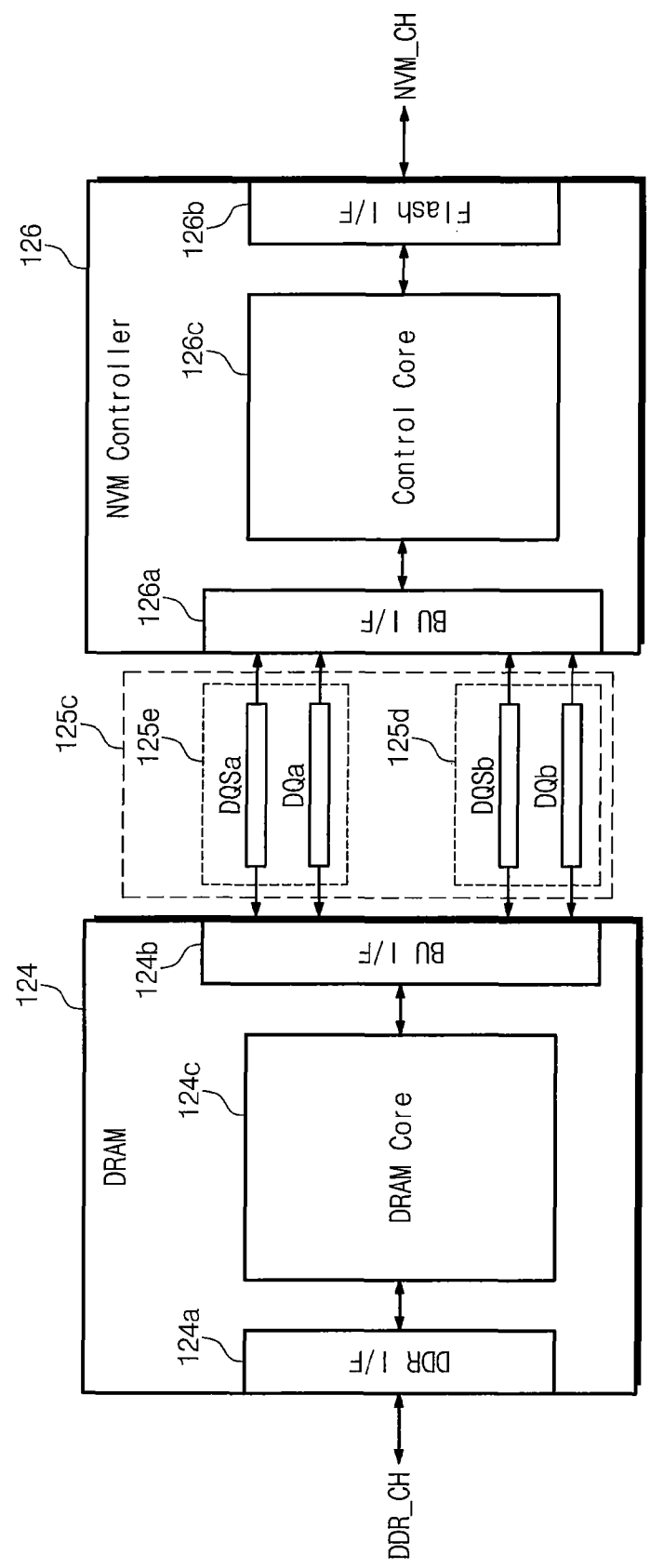

FIGS. 11A to 11C are diagrams schematically illustrating a backup channel according to various embodiments of the inventive concept. FIG. 11A shows an example of a backup channel where bidirectional serial communication is possible, FIG. 11B shows an example of a backup channel where bidirectional parallel communication is possible, and FIG. 11C shows an example of a backup channel where a transmission channel and a receipt channel are independent of each other.

Referring to FIG. 11A, a backup channel 125a between the DRAM 124 and the NVM controller 126 may be configured such that a data strobe signal DQS and a data signal DQ are exchanged in both directions. It may be understood that the data strobe signal DQS is replaced with a clock signal. Each of the buffer interface 124b of the DRAM 124 and the buffer interface 126a of the NVM controller 126 may include an error correction engine (e.g., ECC) and an error detection engine (e.g., CRC) as described with reference to FIG. 10.

Referring to FIG. 11B, a backup channel 125b between the DRAM 124 and the NVM controller 126 may be configured such that a data strobe signal DQS and a data signal DQ are exchanged in both directions. However, a bit width of the data signal DQ transmitted at a time may be extended to make a bandwidth wide. This may be accomplished by changing a line for the data signal DQ, transmitted in both directions, from one to two or more.

Referring to FIG. 11C, the backup channel 125c between the DRAM 124 and the NVM controller 126 may be composed of a transmission channel 125e and a receipt channel 125d. In the case where transmission and receipt channels are configured independently of each other, it may be possible to simplify configurations of the backup interfaces 124b and 126a of the DRAM 124 and the NVM controller 126. That is, the NVM controller 126 may transmit a read command or an address to the DRAM 124 through the transmission channel 125c including a data strobe signal DQSa and a data signal DQa. In addition, the NVM controller 126 may receive backup data from the DRAM 124 through the receipt channel 125d including a data strobe signal DQSb and a data signal DQb.

Some embodiments of the backup channel 125 are exemplified. However, the scope and spirit of the inventive concept may not be limited thereto. It may be understood that the backup channel 125 is variously modified or changed through design change or adjustment.

Figure 12:
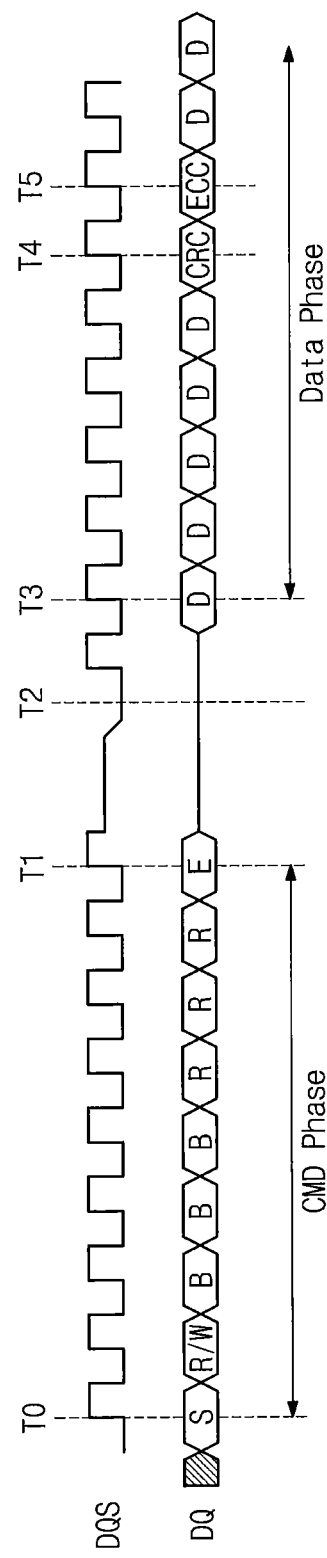
FIG. 12 is a timing diagram schematically illustrating an operation of a backup channel illustrated in FIG. 11A.

FIG. 12 is a timing diagram schematically illustrating an operation of a backup channel illustrated in FIG. 11A. Referring to FIG. 12, the NVM controller 126 may provide a data read command and an address to the DRAM 124 for backup. The DRAM 124 may transmit read-requested data to the NVM controller 126 through a backup channel 125. Data exchange through a backup channel of a bidirectional manner may be divided into a command phase and a data phase.

If a backup operation is required, the NVM controller 126 may enter the command phase for transmitting a read command to the DRAM 124 through the backup channel 125. The NVM controller 126 may occupy a master authority about the backup channel 125 with a default value. To transmit a read command, the NVM controller 126 may transmit a start bit S at T0 in synchronization with a data strobe signal DQS. The NVM controller 126 may transmit an attribute bit R/W, indicating an attribute of a command such as reading or writing, following the start bit S and may then transmit address bits for bank or row selection. If a transfer of address bits B and R is completed, at T1, the NVM controller 126 may transmit an end bit E for terminating the command phase.

The NVM controller 126 may float a DQS line with a high-impedance (Hi-Z) state in synchronization with termination of the command phase. In this case, the authority on the backup channel 125 may be handed over to the DRAM 124 from the NVM controller 126.

The DRAM 124 may sense backup data internally in response to the read command from the NVM controller 126. Under control of the NVM controller 126, the data strobe signal DQS may transition to a low level at T2 when the backup data is ready to be outputted. From this point in time, the data phase may start. The DRAM 124 may start outputting the backup data after a preamble (e.g., a predetermined clock) of the data strobe signal DQS. Data bits D may be sequentially transferred through the data line DQ. For example, the data bits may be sequentially transferred by the page. In addition, in the case where ECC or CRC about the backup data is added as parity on the DRAM 124, such bits may be transferred in the data phase.

Some embodiments of the inventive concept are exemplified as communication between the DRAM 124 and the NVM controller 126 is made through the backup channel 125 of a bidirectional manner. However, it may be understood that the backup channel 125 according to the inventive concept may be implemented to include independent transmission and receipt lines or such that data is exchanged by a unit of a plurality of data lines DQ.

Figure 13:
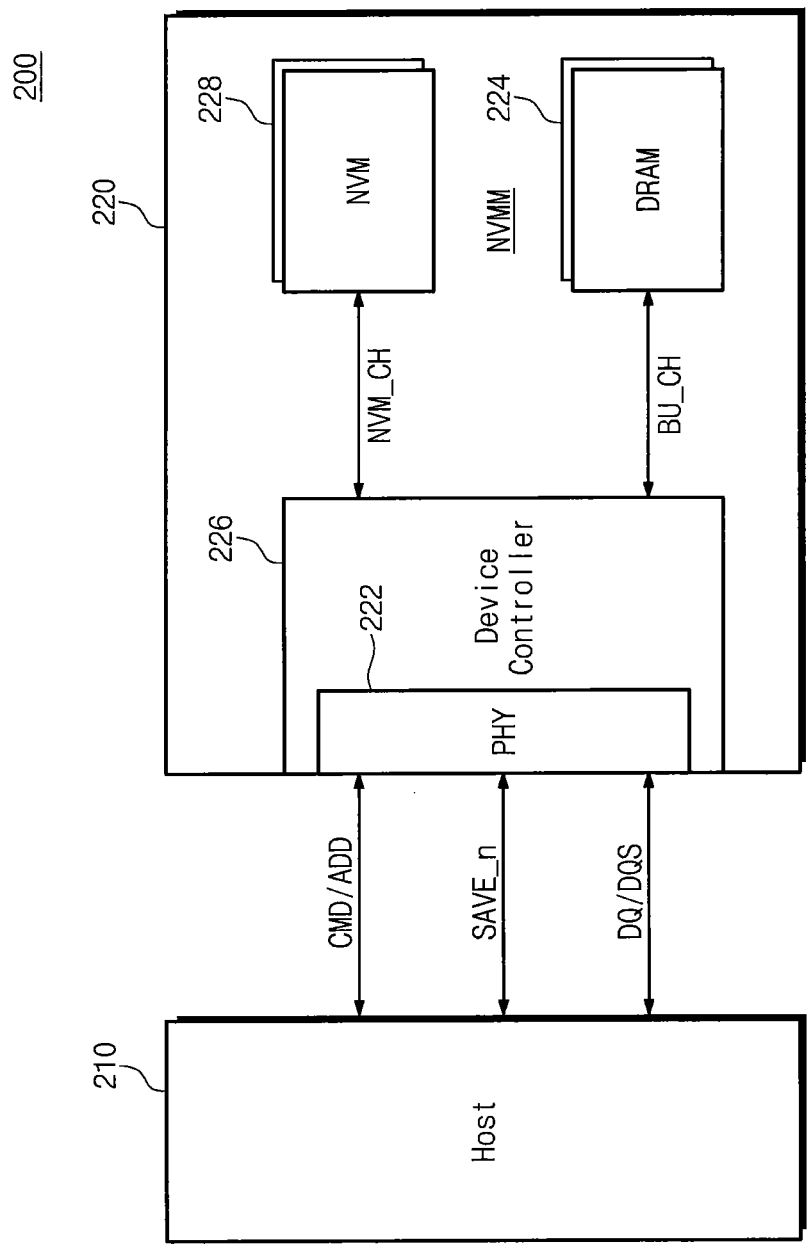
FIG. 13 is a block diagram illustrating a user device according to some embodiments of the inventive concept.

FIG. 13 is a block diagram illustrating a user device 200 according to some embodiments of the inventive concept. Referring to FIG. 13, a user device 200 may include a host 210 and a nonvolatile memory module 220. The nonvolatile memory module 220 may be used as a storage of the user device 200, and the DRAM 224 may be used as a buffer memory a the storage. A function and an operation of the host 210 may be substantially the same as that of FIG. 1, and a description thereof is thus omitted.

The nonvolatile memory module 220 may include a control circuit 226, a DRAM 224, and a nonvolatile memory 228. The device controller 226 may include a physical layer 222 for low-level interfacing with the host 210. Through the physical layer 222, the host 210 may control such that data loaded onto the DRAM 224 is backed up in the nonvolatile memory 228. In some embodiments, the device controller 226 may detect power failure or power loss (or interruption) and may control such that data of the DRAM 224 is backed up in the nonvolatile memory 228.

To backup data of the DRAM 224 in the nonvolatile memory 228, the DRAM 224 and the device controller 226 may exchange data with each other through the backup channel BU_CH. As described above, the backup channel BU_CH may use a serial communication manner including a data strobe signal DQS (or a clock) and a data signal DQ. For this reason, the DRAM 224 may have a separate interface for exchanging data through the backup channel BU_CH.

If receiving a control signal SAVE_n or a command for performing a backup operation from the host 210, the device controller 226 may activate an auxiliary power source for supporting the backup operation. The device controller 226 may transmit a read command to the DRAM 224 through the backup channel BU_CH with an auxiliary power supplied. Afterwards, the DRAM 224 may transmit the backup data to the device controller 226, and the device controller 226 may program the backup data at the nonvolatile memory 228.

The backup channel BU_CH for exchange of backup data between the DRAM 224 and the device controller 226 may be implemented using a signal manner or error detection and error detection manners described with reference to FIGS. 1 to 12. A detailed description about the backup channel BU_CH is thus omitted.

Figure 14:
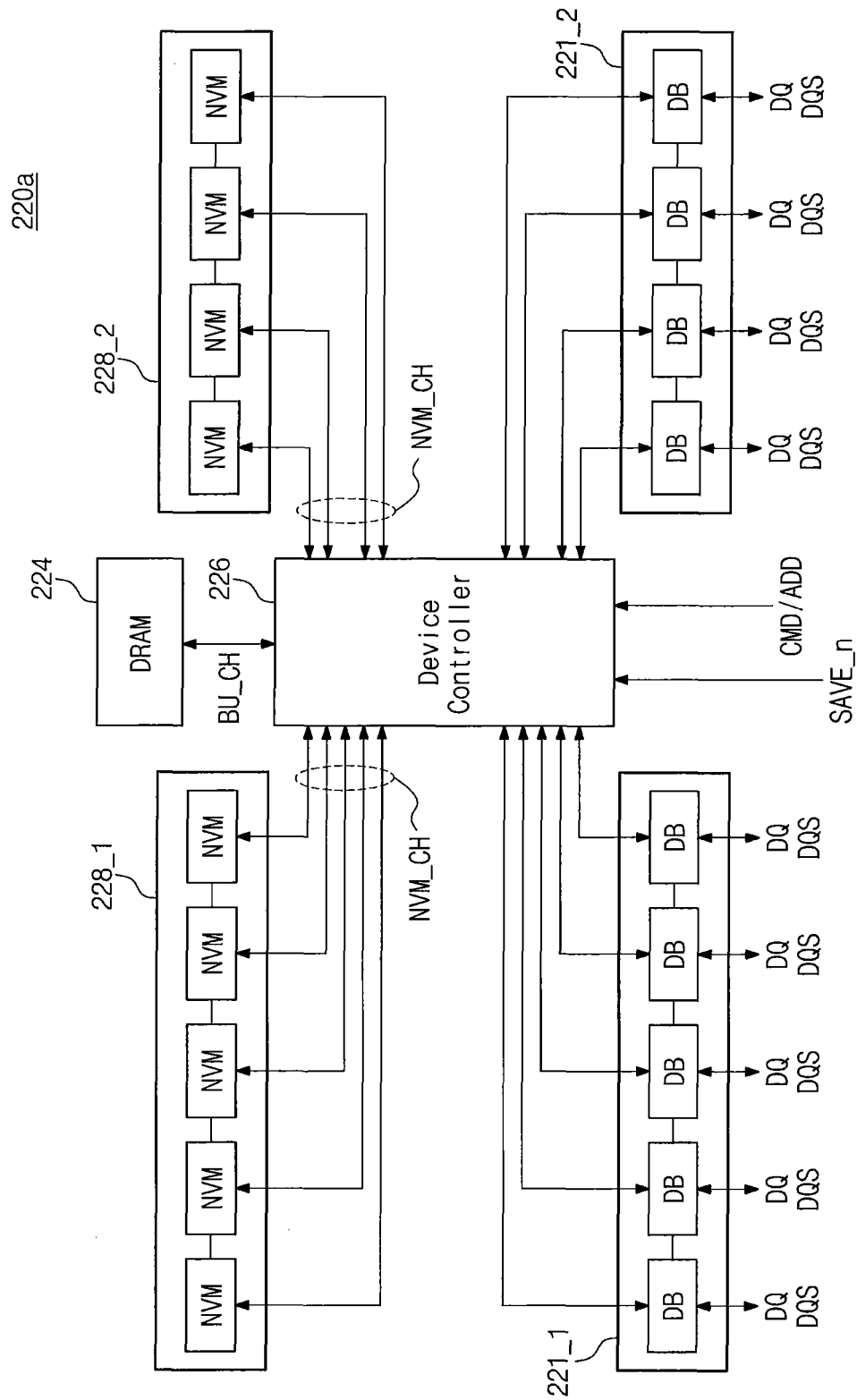
FIG. 14 is a block diagram schematically illustrating a nonvolatile memory module illustrated in FIG. 13.

FIG. 14 is a block diagram schematically illustrating a nonvolatile memory module illustrated in FIG. 13. Referring to FIG. 14, a nonvolatile memory module 220a may include a data buffer (221_1, 221_2), a DRAM 224, a device controller 226, and a nonvolatile memory (228_1, 228_2).

The data buffer (221_1, 221_2) may receive a data signal DQ and a data strobe signal DQS from the host 210 and may transfer the received data signal DQ and data strobe signal DQS to the device controller 226. As the data buffer (221_1, 221_2) exists, the nonvolatile memory module 220a may have, for example, a structure compatible with a load reduced DIMM (LRDIMM).

The device controller 226 may receive a control signal (e.g., SAVE_n) and a command/address CMD/ADD from the host 210. The device controller 226 may store data provided from the host 210 in the nonvolatile memory (228_1, 228_2) by using the DRAM 224 as a buffer. In contrast, the device controller 226 may transmit data stored in the nonvolatile memory (228_1, 228_2) to the host 210 by using the DRAM 224 as a buffer. A backup channel according to the inventive concept may be used between the DRAM 224 and the device controller 226.

If receiving a control signal SAVE_n or a backup start command from the host 210, the device controller 226 may transmit a read command to the DRAM 224 through the backup channel BU_CH. Afterwards, the DRAM 224 may transmit the backup data to the device controller 226, and the device controller 226 may program the backup data at the nonvolatile memory (228_1, 228_2).

Figure 15:
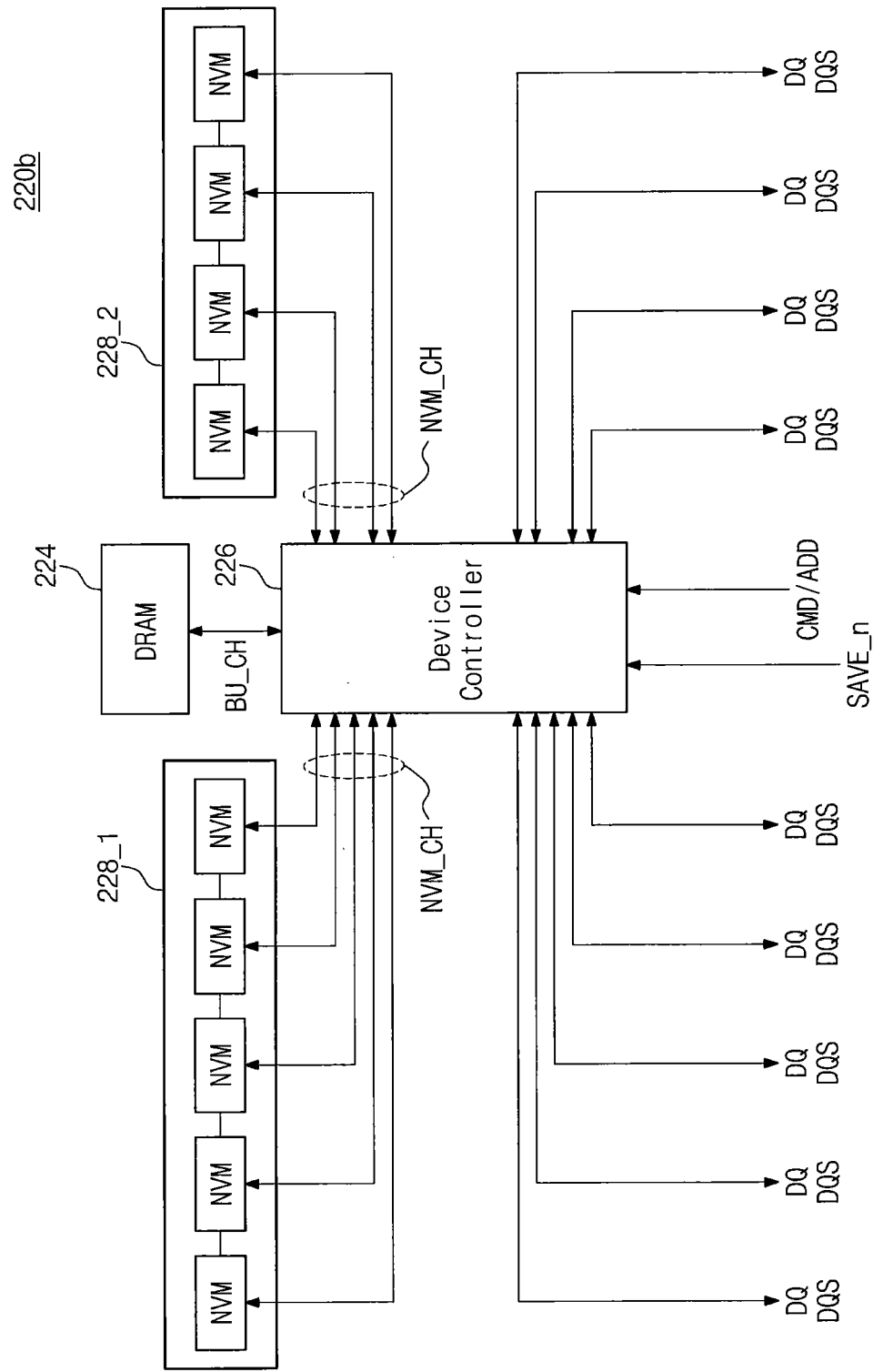
FIG. 15 is a block diagram schematically illustrating a nonvolatile memory module illustrated in FIG. 13, according to some other embodiments of the inventive concept.

FIG. 15 is a block diagram schematically illustrating a nonvolatile memory module illustrated in FIG. 13, according to some other embodiments of the inventive concept. A nonvolatile memory module 220b may include a DRAM 224, a device controller 226, and a nonvolatile memory (228_1, 228_2). Compared with the nonvolatile memory module 220a of FIG. 14, the nonvolatile memory module 220b of FIG. 15 may not include a data buffer. This structure may mean that the nonvolatile memory module 220b is compatible with a memory module of a reduced DIMM (RDIMM) form. Functions and structures of the DRAM 224, the device controller 226, and the nonvolatile memory (228_1, 228_2) may be substantially the same as those described with reference to FIG. 14, and a description thereof is thus omitted.

Figure 16:
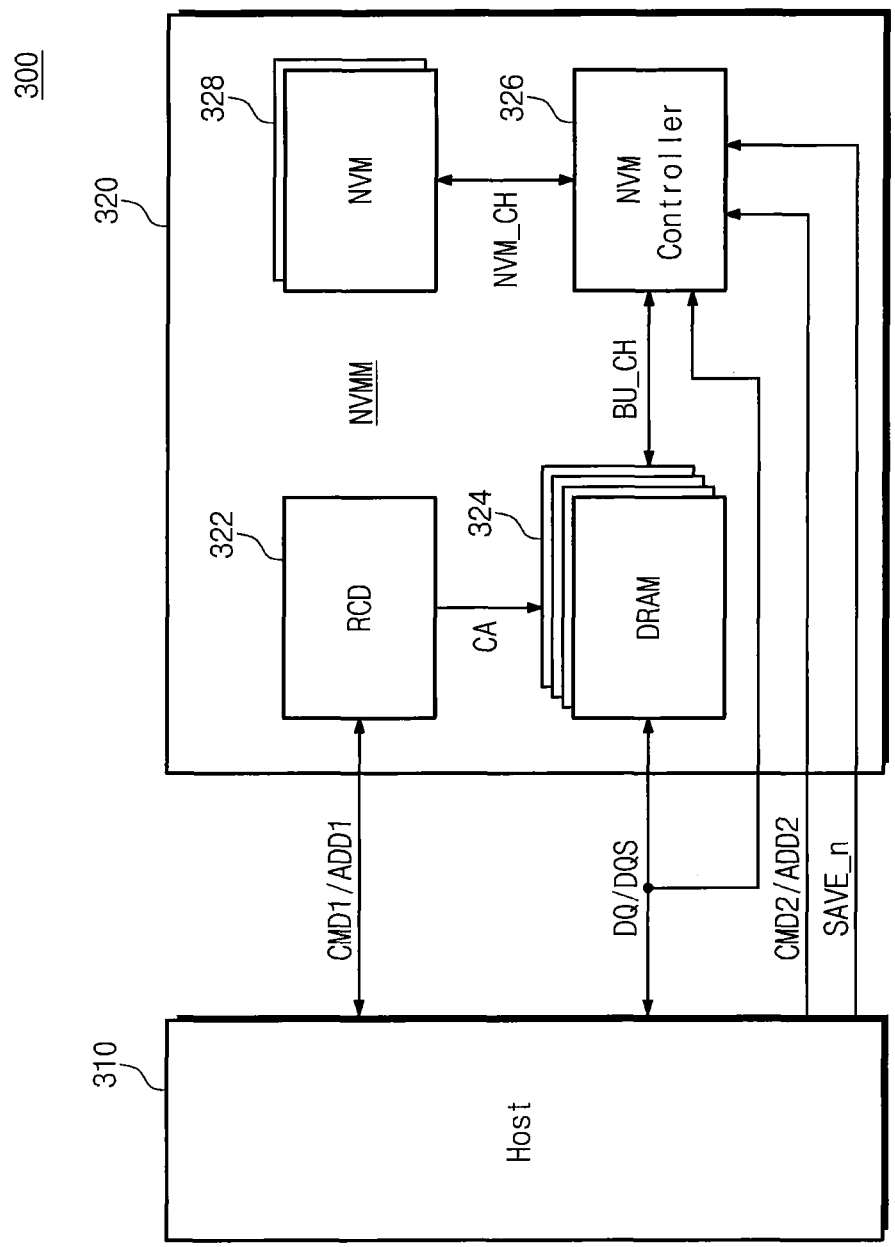
FIG. 16 is a block diagram illustrating a user device according to some embodiments of the inventive concept.

FIG. 16 is a block diagram illustrating a user device 300 according to some embodiments of the inventive concept. Referring to FIG. 16, a user device 300 may include a host 310 and a nonvolatile memory module 320. The host 310 may recognize the nonvolatile memory module 320 as a working memory such as a DRAM module or nonvolatile storage.

The host 310 may recognize the nonvolatile memory module 310 as a DRAM module and may use the nonvolatile memory module 310 as a main memory. That is, the host 310 may recognize a DRAM 324 and a nonvolatile memory 328 as different ranks and may access them independently of each other. In some embodiments, the host 310 may share a data signal DQ and a data strobe signal DQS of the nonvolatile memory module 320, but the host 310 may access one of the DRAM 324 and the nonvolatile memory 328 through a command/address ADD1/CMD1 or ADD2/CMD2. When power failure occurs, the host 310 may provide hint information about such situation to the nonvolatile memory module 320 through a command or a control signal. For example, such information may be provided to the nonvolatile memory module 320 using a control signal SAVE_n.

The nonvolatile memory module 320 may include an RCD 322, the DRAMs 324, a NVM controller 326, and the nonvolatile memory 328. The RCD 322 may buffer a command/address CMD1/ADD1 which the host 310 provides. The RCD 322 may provide the buffered command/address CMD1/ADD1 to the DRAM 324. As described above, the RCD 322 may provide a command for controlling a data buffer (not shown) placed in front of the RCD 322. The RCD 322 may buffer a control signal CTRL provided from the host 310 and may provide the buffered control signal to the DRAM 324 or the NVM controller 326. In some cases, the RCD 322 may transmit a control signal SAVE_n for backup provided from the host 310 to the NVM controller 326.

The DRAM 324 may exchange data with the host 310 through the main channel M_CH and may exchange data with the NVM controller 326 through the backup channel BU_CH. The DRAM 324 may store data provided from the host 310 through the main channel M_CH. The DRAM 324 may output data, which is requested by the host 310, using a data signal PQ and a data strobe signal DQS of the main channel M_CH. The DRAM 324 may include the backup channel BI_CH for communication with the NVM controller 326, independently of the main channel M_CH. The backup channel BU_CH may be implemented with a serial interface of which the signal manner, the protocol, bandwidth, and the like are different from those of the main channel M_CH. A configuration and a function of the DRAM 324 may be substantially the same as those described with reference to FIG. 1, and a detailed description thereof is thus omitted. In addition, a protocol manner of the main channel M_CH or a characteristic of the backup channel BU_CH may be substantially the same as that described with reference to FIG. 1, and a detailed description thereof is thus omitted.

The NVM controller 326 may be provided with a command/address CMD2/ADD2 of the host 310. The NVM controller 326 may exchange data with the host 310 using the data signal DQ and the data strobe signal DQS. In any mode of operation, the NVM controller 326 may operate to be recognized by the host 310 as different ranks through an operation independent of the RCD 322. In any other mode of operation, the NVM controller 326 may be used for backup of the DRAM 324.

If receiving a control signal (e.g., SAVE_n) or a command indicating a backup start from the host 310, the NVM controller 326 may switch from a power of the nonvolatile memory module 320 to an auxiliary power for a backup operation. The NVM controller 326 may backup data stored in the DRAM 324 in the nonvolatile memory 328. In this case, the backup channel BU_CH may be provided between the DRAM 324 and the NVM controller 326 to move data stored in the DRAM 324 to the NVM controller 326.

Figure 17:
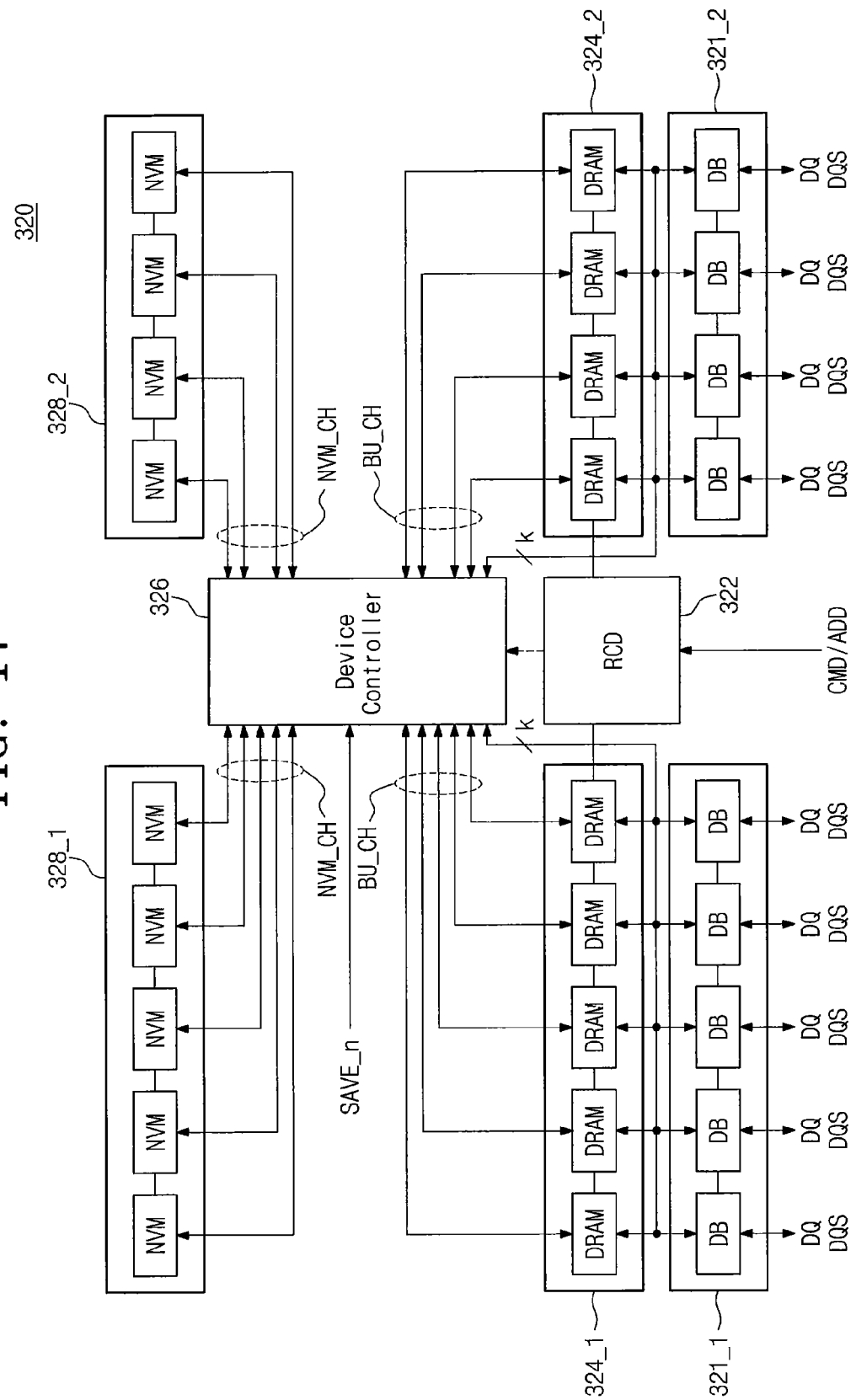
FIG. 17 is a block diagram schematically illustrating a nonvolatile memory module illustrated in FIG. 16.

FIG. 17 is a block diagram schematically illustrating a nonvolatile memory module illustrated in FIG. 16. Referring to FIG. 17, the nonvolatile memory module 320 may include a data buffer (321_1, 321_2), an RCD 322, the DRAM (324_1 to 324_2), the NVM controller 326, and the nonvolatile memory (328_1, 328_2). The data buffer (321_1, 321_2), the DRAM (324_1 to 324_2), and the nonvolatile memory (328_1, 328_2) may be substantially the same as those described with reference to FIG. 1, and a detailed description thereof is thus omitted.

In the nonvolatile memory module 320, the host 310 may control the DRAM through a command/address CMD/ADD to be provided to the RCD 322. The host 310 may exchange the data signal DQ and the data strobe signal DQS with the DRAM (324_1 to 324_2) through the data buffer (321_1, 321_2). In addition, the host 310 may directly access the nonvolatile memory (328_1, 328_2) using the command/address CMD/ADD and the data signal DQ and the data strobe signal DQS provided through the data buffer (321_1, 321_2). That is, the host 310 may control the NVM controller 326 to access the nonvolatile memory (328_1, 328_2) independently of the DRAM (324_1, 324_2).

The NVM controller 326 according to some embodiments of the inventive concept may perform the backup operation in response to a command or a control signal (e.g., SAVE_n) from the host 310 or based on internal determination thereof. During the backup operation, the NVM controller 326 may back data stored in the DRAM (324_1, 324_2) up in the nonvolatile memory (328_1, 328_1) using the backup operation BU_CH. A signal manner, a bandwidth, and a protocol different from the main channel M_CH through which the DRAM (324_1, 324_2) communicates with the host 310 may be applied to the backup channel BU_CH between the NVM controller 326 and the DRAM (324_1, 324_2).

Figure 18:
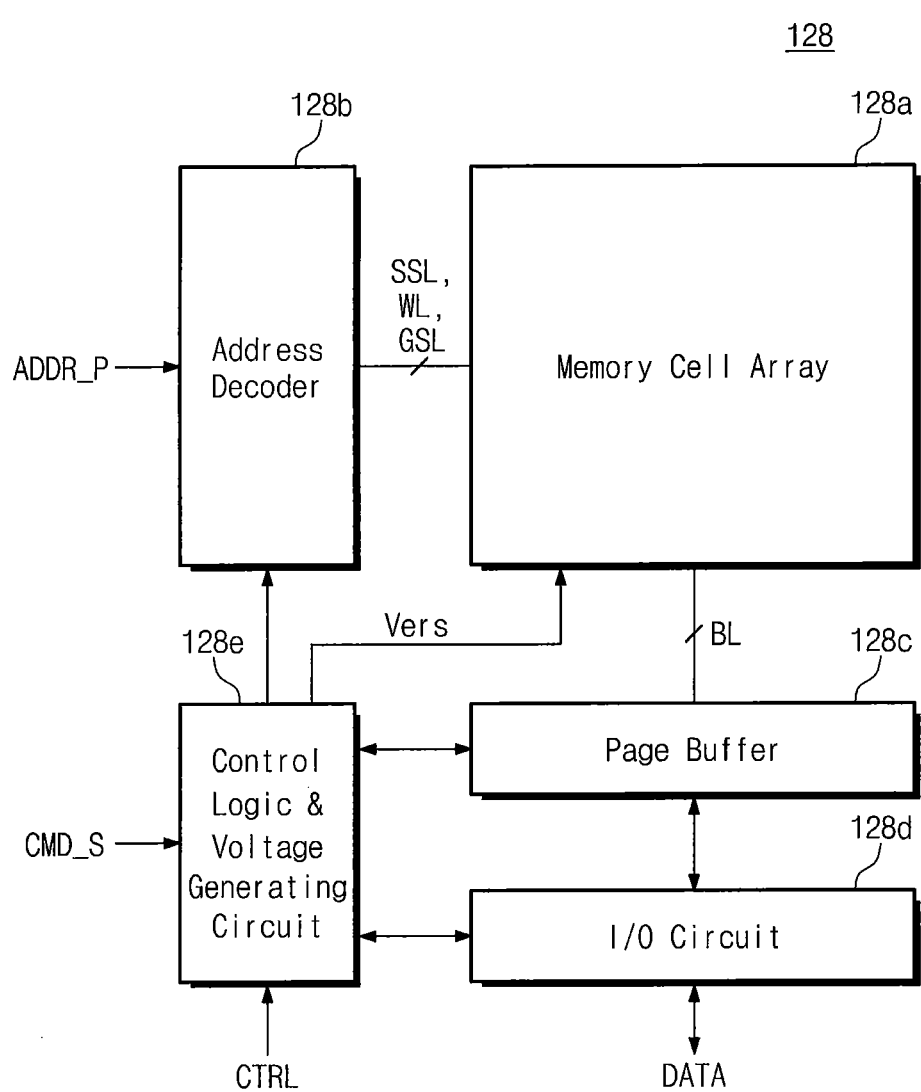
FIG. 18 is a block diagram schematically illustrating a nonvolatile memory described with reference to FIGS. 1, 2, 7, and 13 to 17.

FIG. 18 is a block diagram schematically illustrating a nonvolatile memory described with reference to FIGS. 1, 2, 7, and 13 to 17. A nonvolatile memory 128 of FIG. 1 will be described on behalf of a function or a characteristic of each nonvolatile memory. Referring to FIG. 18, a nonvolatile memory device 128 may include a memory cell array 128a, an address decoder 128b, a page buffer 128c, an input/output circuit 128d, and a control logic and voltage generator circuit 128e.

The memory cell array 128a may include a plurality of memory cells. Each of the memory blocks may include a plurality of cell strings. Each of the cell strings may include a plurality of memory cells. The memory cells may be connected with a plurality of word lines WL. Each memory cell may be a single level cell (SLC) storing one bit or a multi-level cell (MLC) storing at least two bits.

The address decoder 128b may be connected with the memory cell array 128a through the word lines WL, string selection lines SSL, and ground selection lines GSL. The address decoder 128b may receive and decode a physical address ADD_P from an external device (e.g., the device controller 110) and may drive the word lines based on the decoding result. For example, the address decoder 128b may decode a physical address ADD_P received from the external device, may select at least one of the word lines based on the decoded physical address ADD_P, and may drive the selected word line. In some embodiments, the physical address ADD_P may be a physical address which is obtained by converting a storage address ADDR_S (refer to FIGS. 1 and 2) and corresponds to a first nonvolatile memory 131. The above-described address conversion operation may be performed by the device controller 110 or by a flash translation layer (FTL) which is driven by the device controller 110.

The control logic and voltage generator circuit 128e may control the address decoder 128b, the page buffer 128c, and the input/output circuit 128d in response to a storage command CMD and a control logic CTRL from the external device. For example, the control logic and voltage generator circuit 128c may control other components in response to the signals CMD_S and CTRL such that data is stored in the memory cell array 128a. In some embodiments, the control logic and voltage generator circuit 128e may control other components in response to the signals CMD_S and CTRL such that data stored in the memory cell array 128a is transmitted to the external device. In some embodiments, the storage command CMD_S received from the external device may be a modified version of the storage command CMD_S of FIG. 1. The control signal CTRL may be a signal which the device controller 110 provides to control the nonvolatile memory 128.

The control logic and voltage generator circuit 128e may generate various voltages required for the nonvolatile memory device 131 to operate. For example, the control logic and voltage generator circuit 128e may generate a plurality of program voltages, a plurality of pass voltages, a plurality of verification voltages, a plurality of selection read voltages, a plurality of non-selection read voltages, a plurality of erase voltages, and the like. The control logic and voltage generator circuit 128e may provide the generated voltages to the address decoder 128b and/or to a substrate of the memory cell array 128a.

The page buffer 128c may be connected to the memory cell array 128a through the bit lines BL. Under control of the control logic and voltage generator circuit 128e, the page buffer 128c may control the bit lines BL such that data provided from the input/output circuit 128d is stored in the memory cell array 128a. Under control of the control logic and voltage generator circuit 128e, the page buffer 128c may read data stored in the memory cell array 128a and may provide the read data to the input/output circuit 128d. For example, the page buffer 128c may be provided with data from the input/output circuit 128d by the page or may read data from the memory cell array 128a by the page.

The input/output circuit 128d may receive data from the external device and may transfer the received data to the page buffer 128c. In some embodiments, the input/output circuit 128d may receive data from the page buffer 128c and may transmit the received data to the external device (e.g., the device controller 110). For example, the input/output circuit 128d may exchange data with the external device in synchronization with the control signal CTRL.

Figure 19:
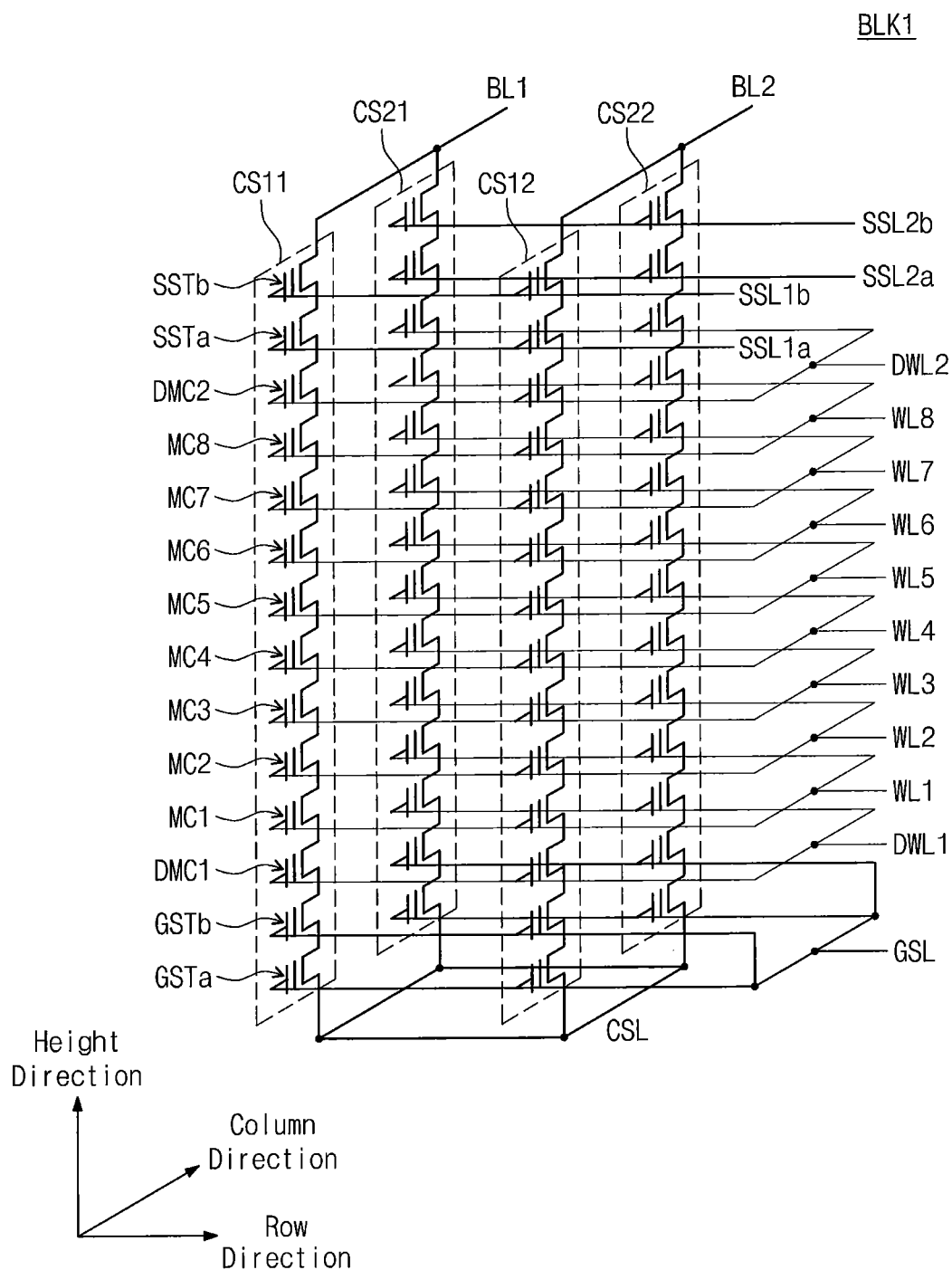
FIG. 19 is a circuit diagram schematically illustrating one of memory blocks included in a cell array of a nonvolatile memory of FIG. 18.

FIG. 19 is a circuit diagram schematically illustrating one of memory blocks included in a cell array of a nonvolatile memory device of FIG. 18. In FIG. 19, there is illustrated a first memory block BLK1 having a three-dimensional structure. However, the scope and spirit of the inventive concept is not limited thereto. Other memory blocks in each of nonvolatile memories A131 to A13n may have the same structure as the first memory block BLK1.

Referring to FIG. 19, the first memory block BLK1 may include a plurality of cell strings CS11, CS21, CS12, and CS22. The cell strings CS11, CS21, CS12, and CS22 may be arranged along a row direction and a column direction and may form rows and columns.

For example, the cell strings CS11 and CS12 may be connected to string selection lines SSL1a and SSL1b to form a first row. The cell strings CS21 and CS22 may be connected to string selection lines SSL2a and SSL2b to form a second row.

For example, the cell strings CS11 and CS21 may be connected to a first bit line BL1 to form a first column. The cell strings CS12 and CS22 may be connected to a second bit line BL2 to form a second column.

Each of the cell strings CS11, CS21, CS12, and CS22 may include a plurality of cell transistors. Each of the cell strings may include string selection transistor SSTa and SSTb, a plurality of memory cells MC1 to MC8, ground selection transistors GSTa and GSTb, and dummy memory cells DMC1 and DMC2.

In some embodiments, each of the memory cells included in the cell strings CS11, CS12, CS21, and CS22 may be a charge trap flash (CTF) memory cell.

The memory cells MC1 to MC8 may be serially connected and may be stacked a height direction being a direction perpendicular to a plane defined by a row direction and a column direction. The string selection transistors SSTa and SSTb may be serially connected and may be disposed between the memory cells MC1 to MC8 and a bit line BL. The ground selection transistors GSTa and GSTb may be serially connected and may be disposed between the memory cells MC1 to MC8 and a common source line CSL.

In some embodiments, a first dummy memory cell DMC1 may be disposed between the memory cells MC1 to MC8 and the ground selection transistors GSTa and GSTb. In some embodiments, a second dummy memory cell DMC2 may be disposed between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL.

In some embodiments, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to a first ground selection line, and the first ground selection transistors GSTa of the cell strings CS21 and CS22 in the second row may be connected to a second ground selection line.

In some embodiments, although not shown, ground selection transistors placed at the same height from a substrate may be connected to the same ground selection line, and ground selection transistors placed at different heights therefrom may be connected to different ground selection lines. For example, the first ground selection transistors GSTa of the cell strings CS11, CS12, CS21, and CS22 may be connected to the first ground selection line, and the second ground selection transistors GSTb thereof may be connected to the second ground selection line.

Memory cells placed at the same height from the substrate (or the ground selection transistors GSTa and GSTb) may be connected in common to the same word line, and memory cells placed at different heights therefrom may be connected to different word lines. For example, the first to eighth memory cells MC8 of the cell strings CS11, CS12, CS21, and CS22 may be connected in common to first to eighth word lines WL1 to WL8, respectively.

String selection transistors, belonging to the same row, from among the first string selection transistors SSTa at the same height may be connected to the same string selection line, and string selection transistors belonging to different rows may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL1a.

Likewise, string selection transistors, belonging to the same row, from among the second string selection transistors SSTb at the same height may be connected to the same string selection line, and string selection transistors in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

Although not shown, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In some embodiments, dummy memory cells at the same height may be connected to the same dummy word line, and dummy memory cells at different heights may be connected with different dummy word lines. For example, the first dummy memory cells DMC1 may be connected to a first dummy word line DWL1, and the second dummy memory cells DMC2 may be connected to a second dummy word line DWL2.

In the first memory block BLK1, read and write operations may be performed by the row. For example, one row of the first memory block BLK1 may be selected by the string selection lines SSL1a, SSL1b, SSL2a, and SSL2b.

For example, the cell strings CS11 and CS12 of the first row may be connected to the first and second bit lines BL1 and BL2 when a turn-on voltage is supplied to the string selection lines SSL1a and SSL1b and a turn-off voltage is supplied to the string selection lines SSL2a and SSL2b. The cell strings CS21 and CS22 of the second row may be connected to the first and second bit lines BL1 and BL2 when a turn-on voltage is supplied to the string selection lines SSL2a and SSL2b and a turn-off voltage is supplied to the string selection lines SSL1a and SSL1b. Memory cells, having the same height, from among memory cells of cell strings in a driven row may be selected by driving a word line. A read or write operation may be performed with respect to the selected memory cells. The selected memory cells may constitute a physical page.

In the first memory block BLK1, erasing may be performed by the memory block or by the sub-block. When erasing is performed by the memory block, all memory cells MC of the first memory block BLK1 may be simultaneously erased according to one erase request. When erasing is performed by the sub-block, a part of memory cells MC in the first memory block BLK1 may be simultaneously erased according to one erase request, and the other thereof may be erase-inhibited. A low voltage (e.g., a ground voltage) may be supplied to a word line connected to the erased memory cells, and a word line connected to erase-inhibited memory cells may be floated.

The first memory block BLK1 illustrated in FIG. 19 may be an example. For example, the number of cell strings may increase or decrease, and the number of rows of cell strings and the number of columns of cell strings may increase or decrease according to the number of cell strings. In the first memory block BLK1, the number of cell strings (GST, MC, DMC, SST, or the like) may increase or decrease, and a height of the first memory block BLK1 may increase or decrease according to the number of cell strings (GST, MC, DMC, SST, or the like). Furthermore, the number of lines (GSL, WL, DWL, SSL, or the like) connected with cell transistors may increase or decrease according to the number of cell strings (GST, MC, DMC, SST, or the like).

Figure 20:
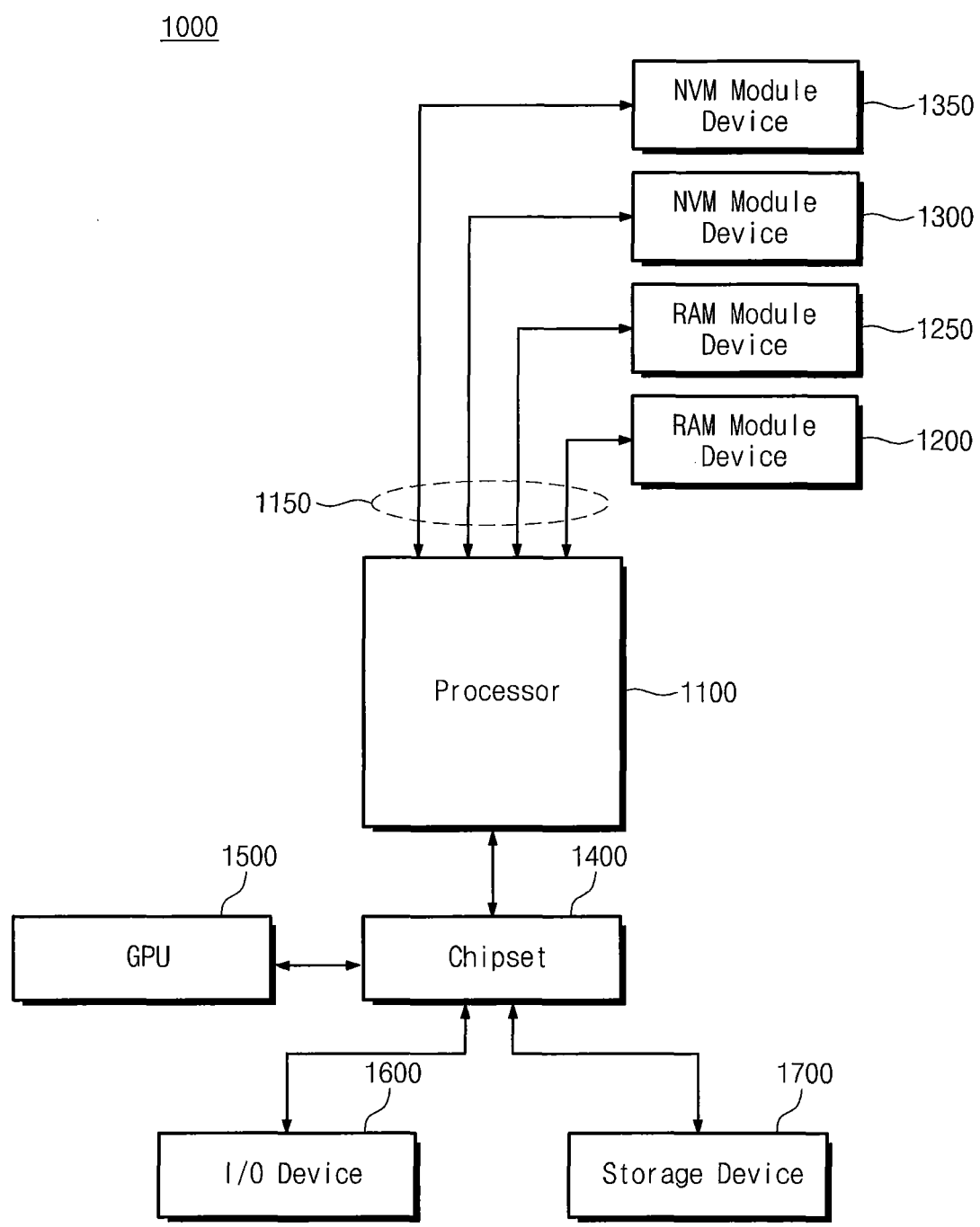
FIG. 20 is a block diagram schematically illustrating a computing system to which a nonvolatile memory module according to the inventive concept is applied.

FIG. 20 is a block diagram schematically illustrating a computing system to which a nonvolatile memory module according to the inventive concept is applied. Referring to FIG. 20, a computing device 1000 may include a processor 1100, RAM modules 1200 and 1250, nonvolatile memory modules 1300 and 1350, a chipset 1400, a graphic processing unit (GPU) 1500, an input/output device 1600, and a storage device 1700.

The processor 1100 may perform various operations of the computing system 1000. The processor 1100 may perform various operations to be executed on the computing system 1000.

The nonvolatile memory modules 1300 and 1350 and the RAM modules 1200 and 1250 may be directly connected with the processor 1100. For example, each of the nonvolatile memory modules 1300 and 1350 and the RAM modules 1200 and 1250 may have a form of a dual in-line memory module (DIMM) and may be mounted on a DIMM socket directly connected to the processor 1100 so as to communicate with the processor 1100. In some embodiments, the nonvolatile memory modules 1300 and 1350 may be implemented with one of nonvolatile memory modules 120, 220, and 230 described with reference to FIGS. 1 to 17.

The nonvolatile memory modules 1300 and 1350 and the RAM modules 1200 and 1250 may communicate with the processor 1100 through the same interface 1150. For example, the nonvolatile memory modules 1300 and 1350 and the RAM modules 1200 and 1250 may communicate with each other through the DDR interface 1150. In some embodiments, the processor 1100 may use the RAM modules 1200 and 1250 as a working memory, a buffer memory, or a cache memory of the computing system 1000.

The chipset 1400 may be electrically connected with the processor 1100 and may control hardware of the computing system 1000 under control of the processor 1100. For example, the chipset 1400 may be connected to each of the GPU 1500, the input/output device 1600, and the storage device 1700 through main buses and may perform a bridge operation with respect to the main buses.

The GPU 1500 may perform a set of arithmetic operations for outputting image data of the computing system 1000. In some embodiments, the GPU 1500 may be embedded in the processor 1100 in the form of a system on chip.

The input/output device 1600 may include various devices which receive data or commands from the computing system 1000 or may output data to an external device. For example, the input/output device 1600 may include user input devices such as a keyboard, a keypad, a button, a touch panel, a touch screen, a touch pad, a touch ball, a microphone, a gyroscope sensor, a vibration sensor, a piezoelectric sensor, and the like and user output devices such as a liquid crystal display (LCD), an organic light emitting diode (OLED) display device, an active matrix MED (AMOLED) display device, a light emitting diode, a speaker, a motor, and the like.

The storage device 1700 may be used as a storage medium of the computing system 1000. The storage device 1700 may include mass storage media such as a hard disk drive (HDD), a solid state drive (SSD), a memory card, a memory stick, and the like.

In some embodiments, the nonvolatile memory modules 1300 and 1350 may be used as a storage medium of the computing system 1000 through the processor 1100. An interface 1150 between the nonvolatile memory modules 1300 and 1350 and the processor 1100 may be faster in speed than that between the storage device 1700 and the processor 1100. That is, the processor 1100 may use the nonvolatile memory modules 1300 and 1350 as a storage medium, thereby improving the performance of the computing system 3000.

Each of the nonvolatile memory modules 1300 and 1350 may back data stored in a DRAM up in a nonvolatile memory in response to a request of the processor 1100 or based on internal detection of power failure. Each of DRAMs included in the nonvolatile memory modules 1300 and 1350 may include a first channel for exchanging data with a host and a second channel for transmitting data to the nonvolatile memory for backup. Different signal manners or protocols may be applied to interfaces for driving the first and second channels of the DRAM. For example, a DDR4 interface protocol may be applied to the first channel for communication with the processor 1100, and a bidirectional or unidirectional serial communication interface may be applied to the second channel for backup.

Figure 21:
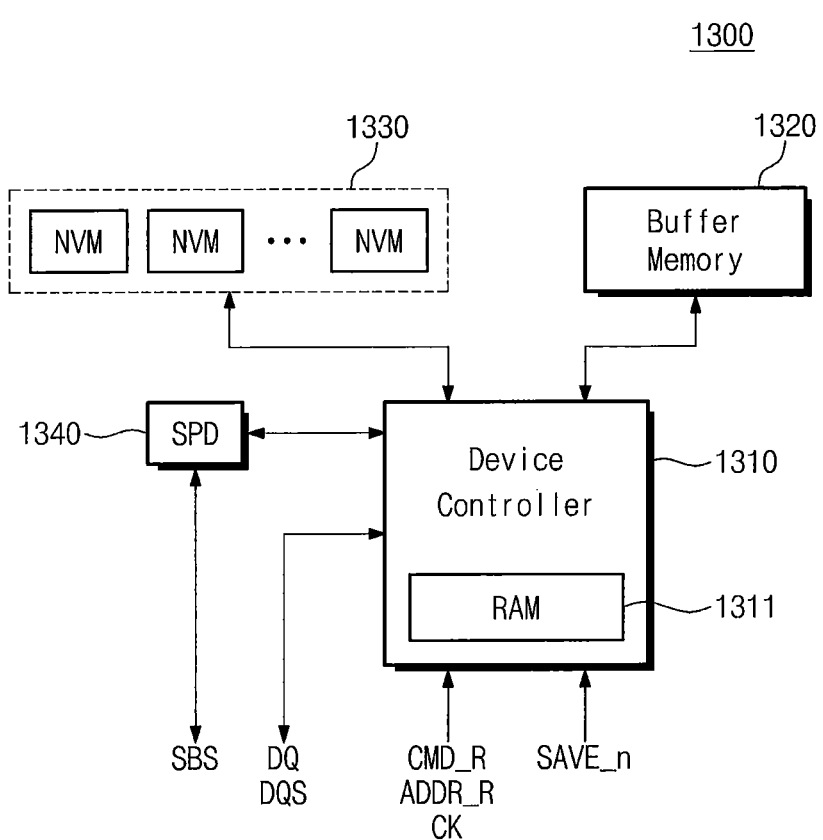
FIG. 21 is a block diagram schematically illustrating one of nonvolatile memory modules of FIG. 20.

FIG. 21 is a block diagram schematically illustrating one of nonvolatile memory modules of FIG. 20. In some embodiments, FIG. 21 is a block diagram of a nonvolatile memory module 1300 with a load reduced DIMM (LRDIMM) form. In some example embodiments, the nonvolatile memory module 1300 illustrated in FIG. 21 may be of the form of a dual in-line memory module (DIMM) and may be mounted on a DIMM socket so as to communicate with the processor 1100.

Referring to FIG. 21, the nonvolatile memory module 1300 may include a device controller 1310, a buffer memory 1320, a nonvolatile memory device 1330, and a serial presence detect chip (SPD) 1340. The device controller 1310 may include a RAM 1311. In some embodiments, the nonvolatile memory device 1330 may include a plurality of nonvolatile memories NVM. Each of the nonvolatile memories included in the nonvolatile memory device 1330 may be implemented with a chip, a package, a device, or a module. Some embodiments provide that the nonvolatile memory device 1330 may be implemented with a chip or a package.

The device controller 1310 may back data stored in the buffer memory 1320 up in the nonvolatile memory 1330 in response to a command or a control signal SAVE_n from the processor 1100. The buffer memory 1320 may include a backup channel as well as a channel for data exchange with the processor 1100.

The SPD 1340 may be a programmable read only memory device (e.g., EEPROM). The SPD 1340 may include initial information or device information of the nonvolatile memory module 1300. In some embodiments, the SPD 1340 may include initial information or device information such as a module type, a module configuration, a storage capacity, a module kind, an execution environment, and the like of the nonvolatile memory module 1300. When a computing system including the nonvolatile memory module 1300 is booted up, the processor 1100 of the computing system may read the SPD 1340 and may recognize the nonvolatile memory module 1300 based on the read result. The processor 1100 may use the nonvolatile memory module 1300 as a storage medium based on the SPD 1340.

In some embodiments, the SPD 1340 may communicate with the processor 1100 through a side-band communication channel. The processor 1100 may exchange a side-band signal SBS with the SPD 1340 through the side-band communication channel. In some embodiments, the SPD 1340 may communicate with the device controller 1310 through the side-band communication channel. In some embodiments, the side-band communication channel may be an I2C communication based channel. In some embodiments, the SPD 1340, the device controller 1310, and the processor 1100 may communicate with each other through I2C communication or may exchange information through the I2C communication.

Figure 22:
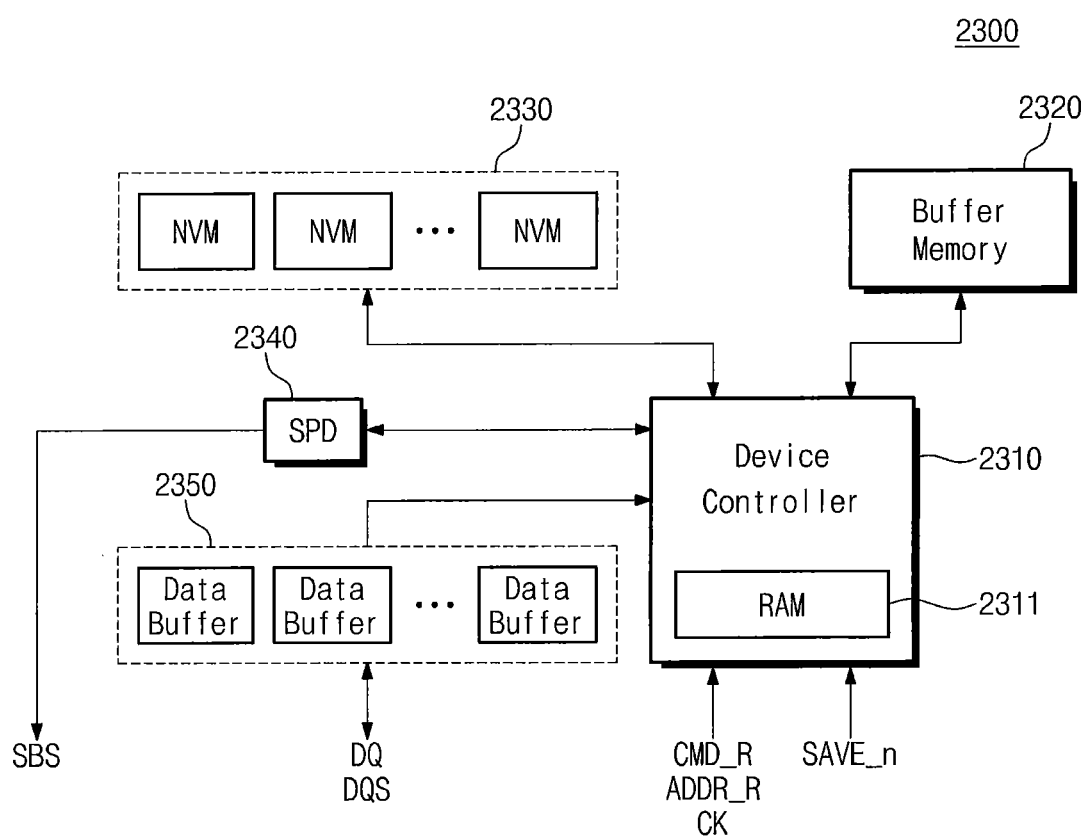
FIG. 22 is a block diagram schematically illustrating one of nonvolatile memory modules of FIG. 20.

FIG. 22 is a block diagram schematically illustrating one of nonvolatile memory modules of FIG. 20. In some embodiments, FIG. 22 is a block diagram of a nonvolatile memory module 2300 with a registered DIMM (RDIMM) form. In some example embodiments, the nonvolatile memory module 2300 illustrated in FIG. 22 may be of the form of a dual in-line memory module (DIMM) and may be mounted on a DIMM socket so as to communicate with the processor 1100.

Referring to FIG. 22, the nonvolatile memory module 2300 may include a device controller 2310, a buffer memory 2320, a nonvolatile memory device 2330, a serial presence detect chip (SPD) 2340, and a data buffer circuit 2350. The device controller 2310 may include a RAM 2311. The device controller 2310, the RAM 2311, the nonvolatile memory device 2330, and the SPD 2340 are described with reference to FIG. 21, and a detailed description thereof is thus omitted.

The data buffer circuit 2350 may receive information or data from the processor 1100 through a data signal DQ and a data strobe signal DQS and may transfer the received information or data to the device controller 2350. Some embodiments provide that the data buffer circuit 2350 may receive information or data from the device controller 2310 and may transfer the received information or data to the processor 1100 through a data signal DQ and a data strobe signal DQS.

In some embodiments, the data buffer circuit 2350 may include a plurality of data buffers. Each of the data buffers may exchange the data signal DQ and the data strobe signal DQS with the processor 1100. Some embodiments provide that each of the data buffers may exchange a signal with the device controller 2310. In some embodiments, each of the data buffers may operate according to control of the device controller 2310.

The device controller 2310 may backup data stored in the buffer memory 2320 in the nonvolatile memory 2330 in response to a command or a control signal SAVE_n from the processor 1100. The buffer memory 2320 may include a backup channel as well as a channel for data exchange with the processor 1100.

Figure 23:
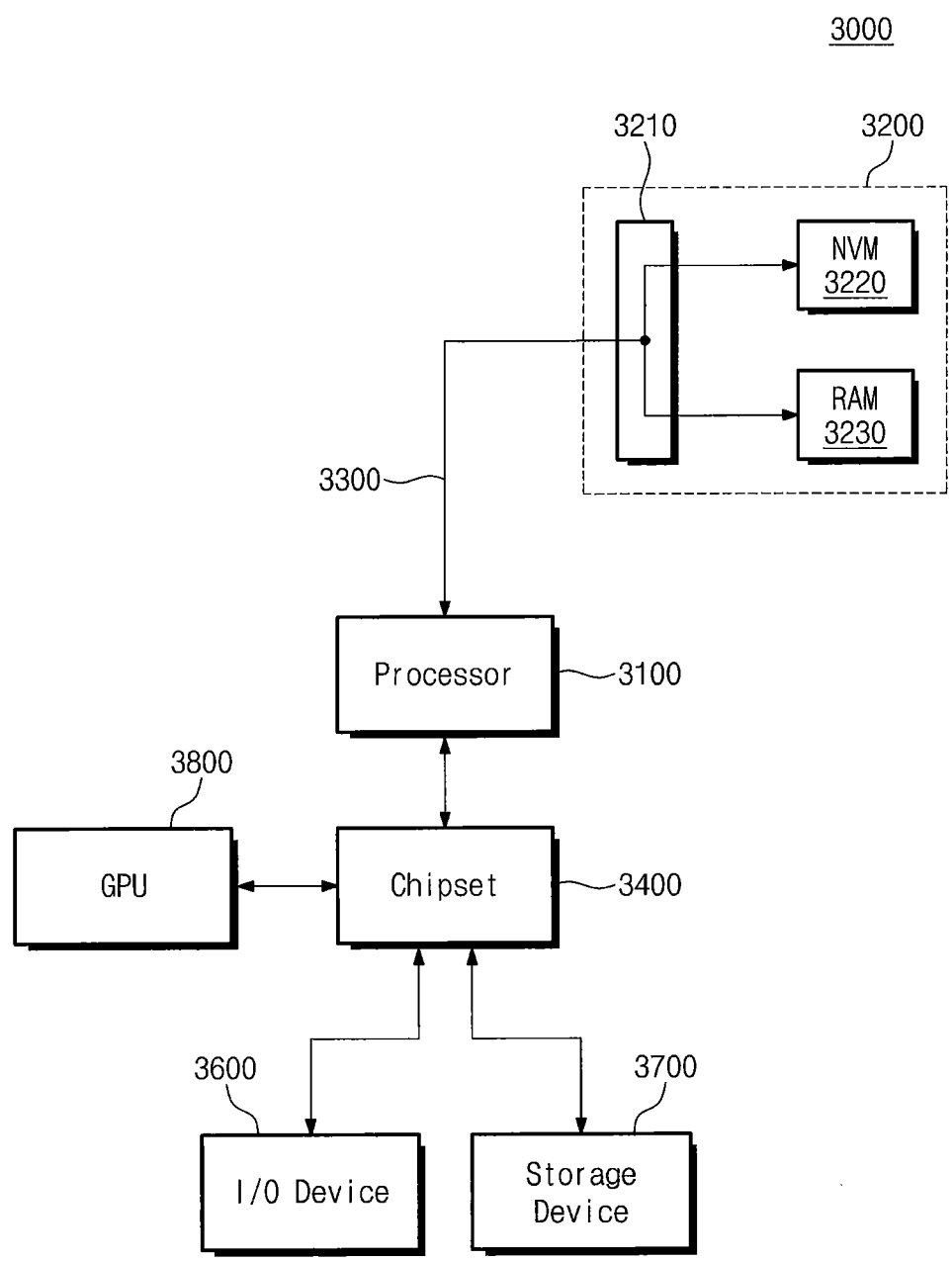
FIG. 23 is a block diagram schematically illustrating a computing system to which a nonvolatile memory module according to the inventive concept is applied.

FIG. 23 is a block diagram schematically illustrating a computing system to which a nonvolatile memory module according to the inventive concept is applied. For descriptive convenience, a detailed description about above-described components may be omitted. Referring to FIG. 23, a computing system 3000 may include a processor 3100, a nonvolatile memory module 3200, a chipset 3400, a graphic processing unit (GPU) 3800, an input/output device 3600, and a storage device 3700. The processor 3100, the chipset 3400, the GPU 3800, the input/output device 3600, and the storage device 3700 are substantially the same as those of FIG. 20, and a detailed description thereof is thus omitted.

The nonvolatile memory module 3200 may be directly connected to the processor 3100. In some embodiments, the nonvolatile memory module 3200 may be of the form of a dual in-line memory module (DIMM) and may be mounted on a DIMM socket so as to communicate with the processor 3100.

The nonvolatile memory module 3200 may include a control circuit 3210, a nonvolatile memory device 3220, and a RAM device 3230. Unlike the nonvolatile memory modules 1300 and 2300 described with reference to FIGS. 20 to 22, the processor 3100 may respectively access the nonvolatile memory device 3220 and the RAM device 3230 of the nonvolatile memory module 3200. In detail, the control circuit 3210 may store received data in the nonvolatile memory device 3210 or the RAM device 3220 in response to control of the processor 3100. In some embodiments, under control of the processor 3100, the control circuit 3210 may transmit data stored in the nonvolatile memory device 3210 to the processor 3100 or data stored in the RAM device 3220 to the processor 3100. That is, the processor 3100 may respectively recognize the nonvolatile memory device 3210 and the RAM device 3220 included in the nonvolatile memory module 3200. The processor 3100 may store data in the nonvolatile memory device 3220 of the nonvolatile memory module 3200 or may read data therefrom. Some embodiments provide that the processor 3100 may store data in the RAM device 3230 or may read data therefrom.

In some embodiments, the processor 3100 may use the nonvolatile memory device 3220 of the nonvolatile memory module 3200 as a storage medium of the computing system 3000 and may use the RAM device 3230 of the nonvolatile memory module 3200 as a main memory of the computing system 3000. That is, the processor 3100 may selectively access the nonvolatile memory device or the RAM device included in a memory module which is mounted on a DIMM socket.

The RAM device 3230 may include a first channel for communication with the processor 3100 and a second channel for backing data up in the nonvolatile memory device 3220.

Figure 24:
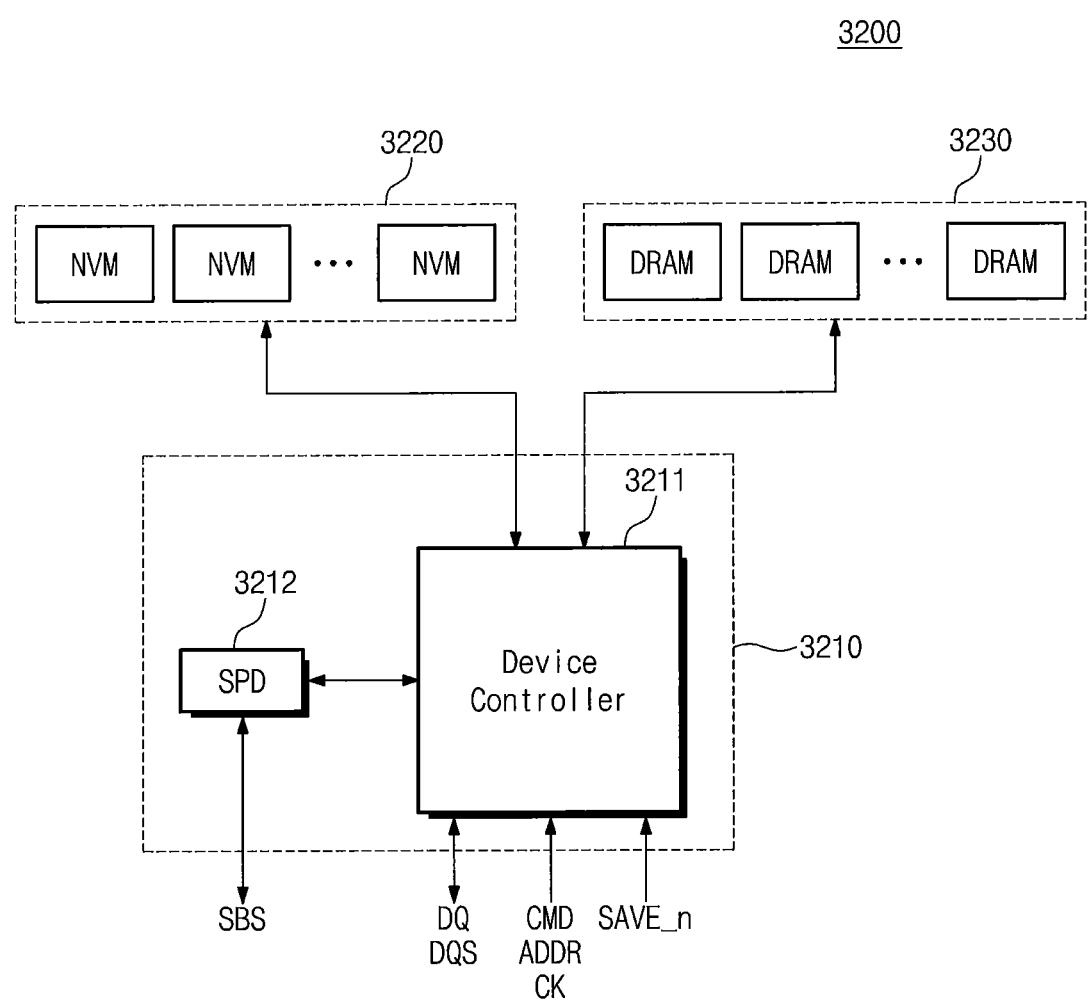
FIG. 24 is a block diagram schematically illustrating a nonvolatile memory module illustrated in FIG. 23.

FIG. 24 is a block diagram schematically illustrating a nonvolatile memory module illustrated in FIG. 23. Referring to FIG. 24, the nonvolatile memory module 3200 may include a control circuit 3210, a nonvolatile memory device 3220, and a RAM device 3230. In an embodiment, the nonvolatile memory device 3220 may include a plurality of nonvolatile memories, and the RAM device 3230 may include a plurality of DRAMs. In some embodiments, the nonvolatile memories may be used as storage of the computing system 3000 through the processor 3100. In an embodiment, each of the nonvolatile memories may include nonvolatile memory elements such as EEPROM, NAND flash memory, PRAM, resistive RAM (ReRAM), FRAM, STT-MRAM, and the like.

The DRAMs may be used as a main memory of the computing system 3000 through the processor 3100. In some embodiments, the RAM device 3230 may include random access memory elements such as DRAM, SRAM, SDRAM, PRAM, ReRAM, FRAM, MRAM, and the like.

The control circuit 3210 may include a device controller 3211 and a SPD chip 3212. The device controller 3211 may receive a command CMD, an address ADDR, and a clock CK from the processor 3100. The device controller 3211 may selectively store data, received through the data signal DQ and the data strobe signal DQS, in the nonvolatile memory device 3220 or the RAM device 3230 in response to signals received from the processor 3100. Some embodiments provide that the device controller 3211 may selectively transfer data, stored in the nonvolatile memory device 3220 or the RAM device 3230, to the processor 3100 through the data signal DQ and the data strobe signal DQS in response to signals received from the processor 3100.

In some embodiments, the processor 3100 may selectively access the nonvolatile memory device 3220 or the RAM device 3230 through a command CMD, an address ADDR, or separate signal or information. That is, the processor 3100 may selectively access the nonvolatile memory device 3220 or the RAM device 3230 included in the nonvolatile memory module 3200. The RAM device 3230 may include a first channel for communication with the processor 3100 and a second channel for backup. The device controller 3211 may perform a backup operation through the second channel of the RAM device 3230 in response to a request of the processor 3100 or based on internal status detection.

Figure 25:
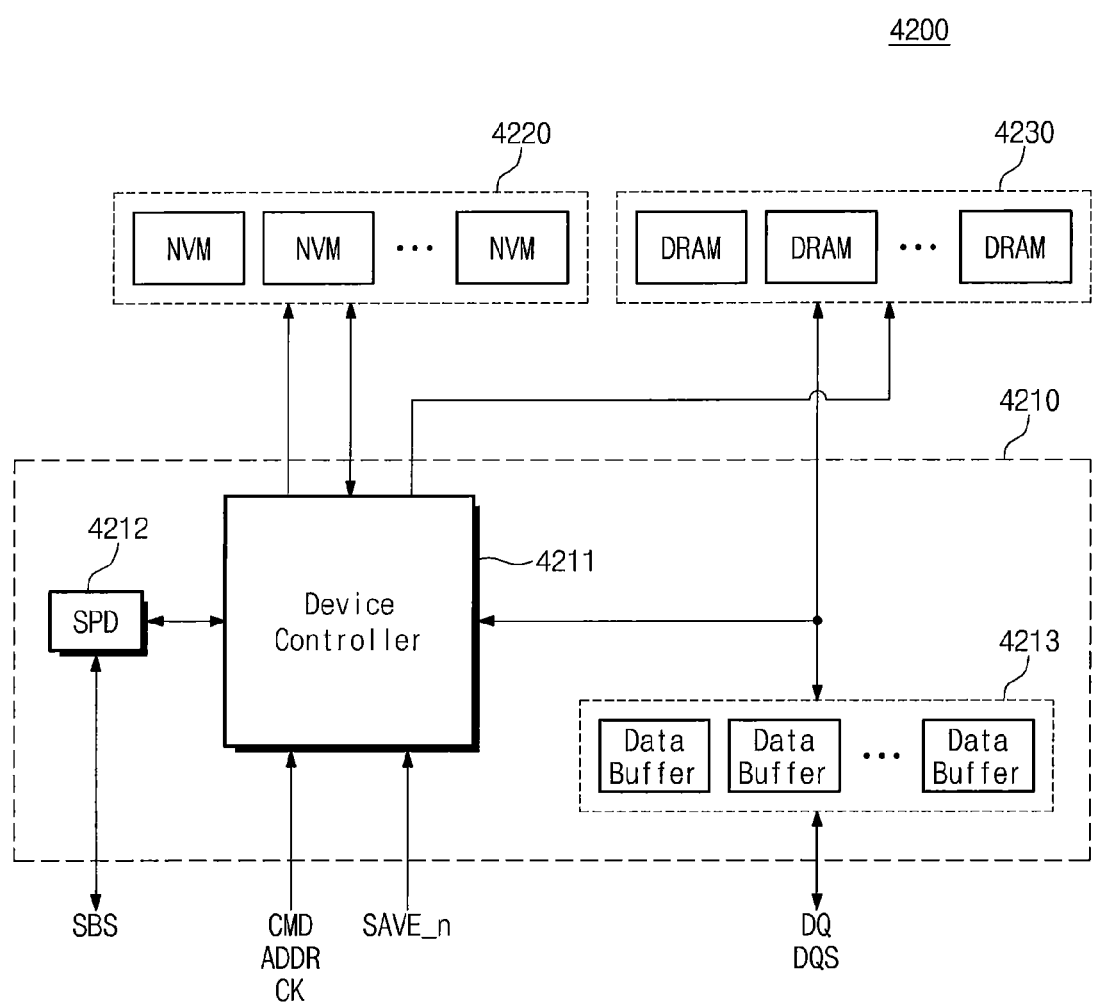
FIG. 25 is a block diagram schematically illustrating a nonvolatile memory module illustrated in FIG. 23.

FIG. 25 is a block diagram schematically illustrating a nonvolatile memory module illustrated in FIG. 23. In some embodiments, a nonvolatile memory module 4200 illustrated in FIG. 25 may be of the form of a dual in-line memory module (DIMM) and may be mounted on a DIMM socket so as to communicate with the processor 3100. Referring to FIG. 25, the nonvolatile memory module 4200 may include a control circuit 4100, a nonvolatile memory device 4220, and a RAM device 4230. The control circuit 4210 may include a device controller 4211, an SPD 4212, and a data buffer circuit 4213. The RAM device 4230 may include a main channel M_CH connected with a data buffer 4213 and a backup channel BU_CH used at a backup operation.

The device controller 4211 may receive a command CMD, an address ADDR, and a clock CK from the processor 3100. The device controller 4211 may back data stored in the buffer memory 4230 up in the nonvolatile memory 4220 in response to a command or a control signal SAVE_n from the processor 3100 or based on internal status detection.

Figure 26:
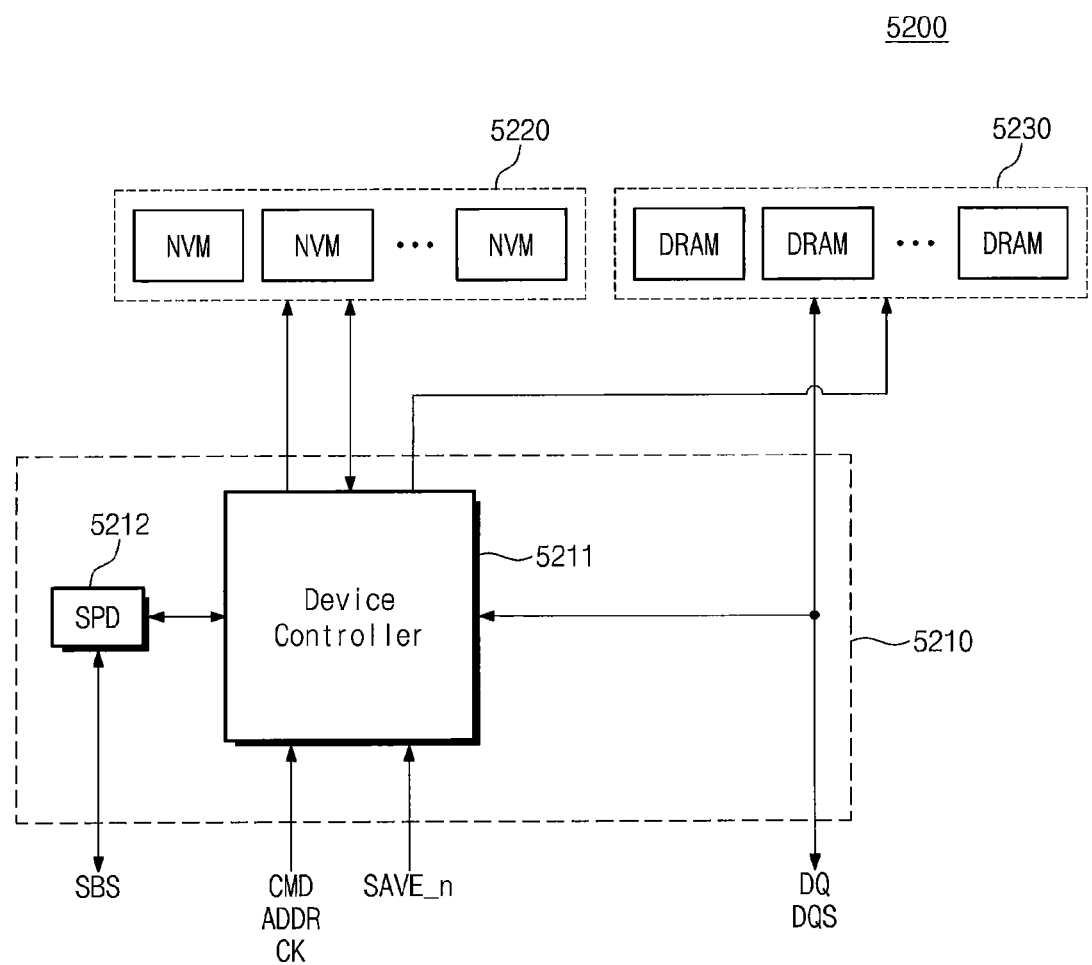
FIG. 26 is a block diagram schematically illustrating a nonvolatile memory module illustrated in FIG. 23.

FIG. 26 is a block diagram schematically illustrating a nonvolatile memory module illustrated in FIG. 23. Referring to FIG. 26, the nonvolatile memory module 5200 may include a control circuit 5210, a nonvolatile memory device 5220, and a RAM device 5230. The control circuit 5210 may include a device controller 5211 and a SPD chip 5212. The nonvolatile memory module 5200 of FIG. 26 may operate to be similar to the nonvolatile memory module 4200 of FIG. 25. However, the nonvolatile memory module 5200 of FIG. 26 may not include the data buffer circuit 4213 unlike the nonvolatile memory module 4200 of FIG. 25. In some embodiments, the nonvolatile memory module 4200 of FIG. 25 may be a memory module of an LRDIMM shape, and the nonvolatile memory module 5200 of FIG. 26 may be a memory module of an RDIMM shape.

According to some embodiments of the inventive concept, backup data may be quickly backed up in a nonvolatile memory through a side-band channel between a volatile memory and a nonvolatile memory controller. Accordingly, it may be possible to restore data easily at a situation such as power failure. This may mean that the performance and reliability of a memory module are improved.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A memory system comprising:
a volatile memory device that is configured to exchange data with a host through a main channel;
a nonvolatile memory device; and
a memory controller that is connected with the volatile memory device through a backup channel,
wherein the memory controller is configured to detect a request of the host or a power state and controls the volatile memory device and the nonvolatile memory device based on a detection result such that data stored in the volatile memory device is backed up in the nonvolatile memory device through the backup channel,
wherein the volatile memory device comprises a first interface for communicating with the host through the main channel and a second interface for communicating with the memory controller through the backup channel, wherein a signal line of the second interface comprises at least one of a data signal (DQ), a data strobe signal (DQS), or a clock signal (CK),
wherein a communication through the second interface comprises a command phase and a data phase,
wherein in the command phase, the memory controller provides a start bit, an end bit, a command bit, and address bits, and
wherein the command bit and the address bits are between the start bit and the end bit.

2. The memory system of claim 1, wherein a bandwidth of the second interface is different from a bandwidth of the first interface.

3. The memory system of claim 2, wherein the first interface is configured to exchange data using at least one of double data rate (DDR), DDR2, DDR3, DDR4, low power DDR (LPDDR), universal serial bus (USB), multimedia card (MMC), embedded MMC, peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), firewire, universal flash storage (UFS), or nonvolatile memory express (NVMe).

4. The memory system of claim 2, wherein the second interface has a serial communication protocol that provides both unidirectional and bidirectional communication functionality.

5. The memory system of claim 4, wherein the second interface comprises at least one of an inter-Integrated circuit (I2C) bus protocol, a universal asynchronous receiver transmitter (UART) bus protocol, a serial peripheral interface (SPI) protocol, a controller area network (CAN) bus protocol, or a system management bus (SMBUS) protocol.

6. The memory system of claim 1, wherein the second interface comprises an error management block that is configured to add an error correction code and/or an error detection code to backup data.

7. The memory system of claim 1, wherein the second interface is configured to transmit backup data by a page unit, by a unit of a plurality of pages, or by a unit smaller than the page unit.

8. The memory system of claim 1, wherein, responsive to a control signal (SAVE_n) from the host, the memory controller is configured to switch from a power for backup to an auxiliary power source and backs up data loaded onto the volatile memory device into the nonvolatile memory device.

9. The memory system of claim 1, wherein the memory system is connected to the host in a form of a dual in-line memory module (DIMM).

10. The memory system of claim 1, further comprising:
a registering clock driver that is configured to buffer and transfer a command, an address, or a control signal of the host to the volatile memory device.

11. The memory system of claim 1, wherein the nonvolatile memory device comprises a three-dimensional memory array.

12. A memory module comprising:
a nonvolatile memory device;
a volatile memory device that includes a first interface for communicating with a host through a first channel; and
a memory controller that is connected with a second interface of the volatile memory device through a second channel that is configured to exchange data with the host through the first channel,
wherein the memory controller is further configured to detect a host request or a power state, and to control the volatile memory device and the nonvolatile memory device based on a detection to back-up data that is stored in the volatile memory device into the nonvolatile memory device through the second channel,
wherein a signal line of the second interface comprises at least one of a data signal (DQ), a data strobe signal (DQS), or a clock signal (CK),
wherein a communication through the second interface comprises a command phase and a data phase,
wherein in the command phase, the memory controller provides a start bit, an end bit, a command bit, and address bits, wherein the command bit and the address bits are between the start bit and the end bit, and wherein the second interface transmits backup data by a page unit, by a unit of a plurality of pages, or by a unit smaller than the page unit.

13. The memory module of claim 12, wherein the first interface exchanges data using at least one of double data rate (DDR), DDR2, DDR3, DDR4, low power DDR (LPDDR), universal serial bus (USB), multimedia card (MMC), embedded MMC, peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), firewire, universal flash storage (UFS), or nonvolatile memory express (NVMe).

14. The memory module of claim 12, wherein the second interface has a serial communication protocol that provides both unidirectional and bidirectional communication functionality, and wherein the second interface comprises at least one of an inter-Integrated circuit (I2C) bus protocol, a universal asynchronous receiver transmitter (UART) bus protocol, a serial peripheral interface (SPI) protocol, a controller area network (CAN) bus protocol, or a system management bus (SMBUS) protocol.

15. The memory module of claim 12, wherein, responsive to a control signal (SAVE_n) from the host, the memory controller is configured to switch from a power for backup to an auxiliary power source and backs up data loaded onto the volatile memory device into the nonvolatile memory device.

16. The memory module of claim 12, further comprising:

a registering clock driver that is configured to buffer and transfer a command, an address, or a control signal of the host to the volatile memory device.

* * * * *